(12) United States Patent
Hirakata et al.

(10) Patent No.: US 10,271,438 B2
(45) Date of Patent: Apr. 23, 2019

(54) LIGHT-EMITTING DEVICE

(71) Applicant: Semiconductor Energy Laboratory Co., Ltd., Atsugi-shi, Kanagawa-ken (JP)

(72) Inventors: Yoshiharu Hirakata, Ebina (JP); Yasuhiro Jinbo, Isehara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 184 days.

(21) Appl. No.: 15/264,771

(22) Filed: Sep. 14, 2016

(65) Prior Publication Data
US 2017/0006716 A1    Jan. 5, 2017

Related U.S. Application Data

(63) Continuation of application No. 14/471,686, filed on Aug. 28, 2014, now Pat. No. 9,460,643.

(30) Foreign Application Priority Data

Sep. 3, 2013 (JP) .................................. 2013-181758

(51) Int. Cl.
*H05K 5/00* (2006.01)
*H01L 51/00* (2006.01)
(Continued)

(52) U.S. Cl.
CPC ......... *H05K 5/0017* (2013.01); *G06F 1/1616* (2013.01); *G09F 9/301* (2013.01);
(Continued)

(58) Field of Classification Search
None
See application file for complete search history.

(56) References Cited

U.S. PATENT DOCUMENTS 3,755,938 A * 9/1973 Bytwork ................ G09F 1/12
40/530
6,372,608 B1   4/2002 Shimoda et al.
(Continued)

FOREIGN PATENT DOCUMENTS

CN    102282535 A    12/2011
CN    103049054 A    4/2013
(Continued)

OTHER PUBLICATIONS

Taiwanese Office Action (Application No. 105130632) dated Aug. 14, 2017.
(Continued)

*Primary Examiner* — Elmito Breval
(74) *Attorney, Agent, or Firm* — Robinson Intellectual Property Law Office; Eric J. Robinson

(57) ABSTRACT

A light-emitting device can be folded in such a manner that a flexible light-emitting panel is supported by a plurality of housings which are provided spaced from each other and the light-emitting panel is bent so that surfaces of adjacent housings are in contact with each other. Furthermore, in the light-emitting device, in which part or the whole of the housings have magnetism, the two adjacent housings can be fixed to each other by a magnetic force when the light-emitting device is used in a folded state.

32 Claims, 19 Drawing Sheets

(51) Int. Cl.
*G09F 9/30* (2006.01)
*H01L 51/52* (2006.01)
*G06F 1/16* (2006.01)
*H01F 1/147* (2006.01)
*H01L 27/32* (2006.01)

(52) U.S. Cl.
CPC ..... *H01F 1/14708* (2013.01); *H01F 1/14791* (2013.01); *H01L 27/3262* (2013.01); *H01L 51/0097* (2013.01); *H01L 51/5237* (2013.01); *H05K 5/0086* (2013.01); *H01L 27/323* (2013.01); *H01L 27/3227* (2013.01); *H01L 51/5246* (2013.01); *H01L 51/5253* (2013.01); *H01L 51/5259* (2013.01); *H01L 2227/326* (2013.01); *H01L 2251/5338* (2013.01); *Y02E 10/549* (2013.01)

(56) References Cited

U.S. PATENT DOCUMENTS

| | | | |
|---|---|---|---|
| 6,828,727 | B2 | 12/2004 | Yamazaki |
| 7,412,271 | B2 | 8/2008 | Cheng |
| 8,138,869 | B1* | 3/2012 | Lauder ................. G06F 1/1613 335/219 |
| 8,155,714 | B2 | 4/2012 | Allard |
| 8,306,575 | B2 | 11/2012 | Kubodera et al. |
| 8,415,208 | B2 | 4/2013 | Takayama et al. |
| 8,654,519 | B2 | 2/2014 | Visser et al. |
| 8,873,225 | B2 | 10/2014 | Huitema et al. |
| 2002/0027636 | A1 | 3/2002 | Yamada |
| 2003/0032210 | A1 | 2/2003 | Takayama et al. |
| 2005/0040425 | A1* | 2/2005 | Akita ................. H01L 33/0079 257/103 |
| 2007/0152306 | A1* | 7/2007 | Shih ................. C23C 18/1889 257/642 |
| 2008/0049003 | A1 | 2/2008 | Hasegawa |
| 2009/0239320 | A1 | 9/2009 | Takayama et al. |
| 2010/0064244 | A1 | 3/2010 | Kilpatrick et al. |
| 2010/0066643 | A1 | 3/2010 | King et al. |
| 2010/0085382 | A1* | 4/2010 | Lundqvist ............. G06F 1/1616 345/659 |
| 2010/0178452 | A1* | 7/2010 | Yoon ................. G02F 1/133305 428/107 |
| 2011/0210949 | A1* | 9/2011 | Yamazaki ............. G09G 3/3648 345/204 |
| 2011/0285607 | A1 | 11/2011 | Kim |
| 2012/0217516 | A1 | 8/2012 | Hatano et al. |
| 2012/0264489 | A1* | 10/2012 | Choi ................. H04M 1/0216 455/566 |
| 2012/0313137 | A1* | 12/2012 | Shin ................. H01L 51/5243 257/100 |
| 2012/0314399 | A1 | 12/2012 | Bohn et al. |
| 2013/0010405 | A1 | 1/2013 | Rothkopf et al. |
| 2013/0120912 | A1 | 5/2013 | Ladouceur et al. |
| 2013/0221840 | A1 | 8/2013 | Oh |
| 2013/0257685 | A1 | 10/2013 | Kim |
| 2014/0071101 | A1 | 3/2014 | Kim |
| 2014/0124028 | A1* | 5/2014 | Kim ................. H01L 31/03928 136/256 |
| 2014/0345677 | A1* | 11/2014 | Yim ................. C22C 19/03 136/252 |
| 2014/0357364 | A1 | 12/2014 | Chudek |

FOREIGN PATENT DOCUMENTS

| | | |
|---|---|---|
| CN | 203086539 | 7/2013 |
| EP | 2388687 A | 11/2011 |
| EP | 2521002 A | 11/2012 |
| EP | 2521003 A | 11/2012 |
| JP | 2003-174153 A | 6/2003 |
| JP | 2006-243621 A | 9/2006 |
| JP | 2009-089377 A | 4/2009 |
| JP | 2011-100221 A | 5/2011 |
| JP | 2011-118082 A | 6/2011 |
| JP | 2011-250393 A | 12/2011 |
| TW | 383016 | 2/2000 |
| TW | 200947373 | 11/2009 |
| TW | 201003513 | 1/2010 |
| TW | 201005701 | 2/2010 |
| TW | 201042424 | 12/2010 |
| TW | 201301002 | 1/2013 |
| TW | 201331823 | 8/2013 |
| WO | WO-2001/053919 | 7/2001 |
| WO | WO-2002/033685 | 4/2002 |
| WO | WO-2009/067010 | 5/2009 |
| WO | WO-2009/131447 | 10/2009 |
| WO | WO-2009/158635 | 12/2009 |
| WO | WO-2012/170593 | 12/2012 |
| WO | WO-2013/073279 | 5/2013 |

OTHER PUBLICATIONS

Taiwanese Office Action (Application No. 103129549) dated Sep. 25, 2017.
Taiwanese Office Action (Application No. 103129549) dated Jun. 7, 2018.
Taiwanese Office Action (Application No. 103129549) dated Feb. 27, 2018.

* cited by examiner

FIG. 3A1
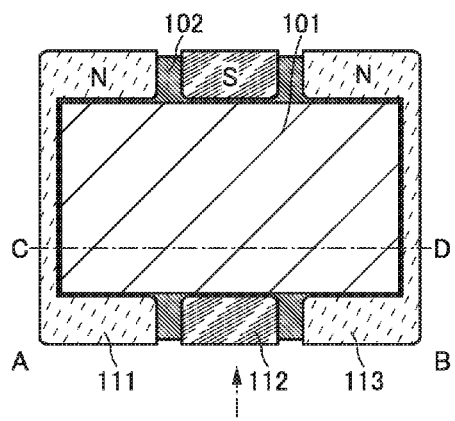
FIG. 3A2
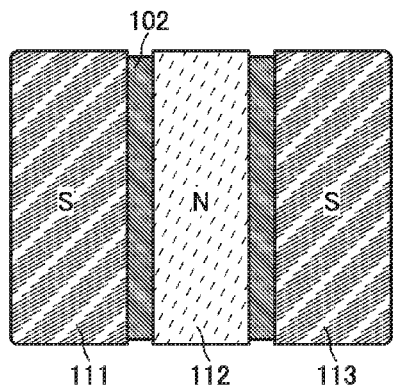
FIG. 3B1
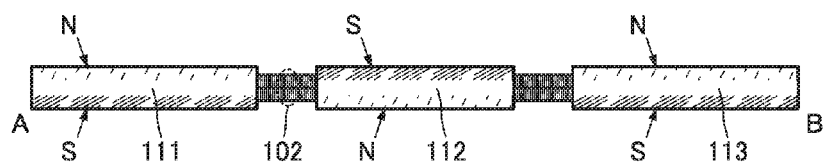
FIG. 3B2
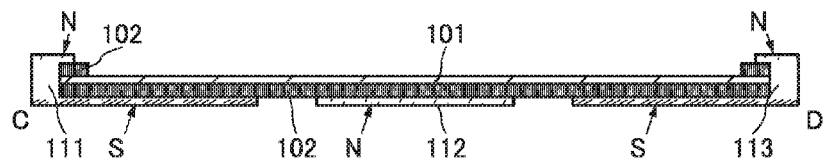
FIG. 3C
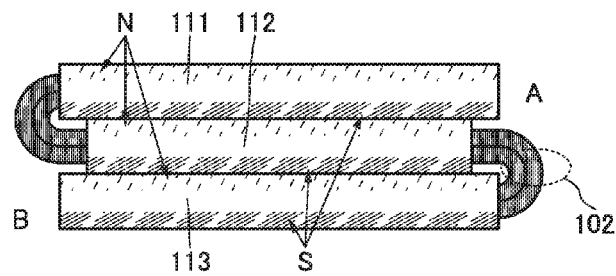

FIG. 4A1 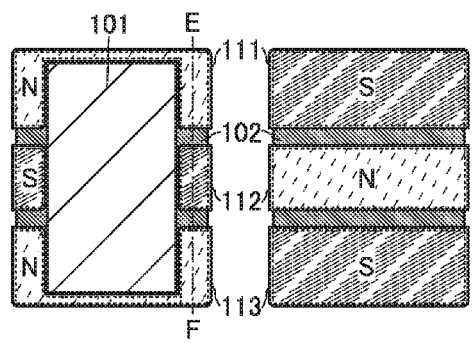　FIG. 4A2 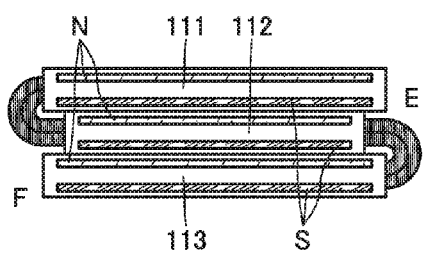
FIG. 4B1 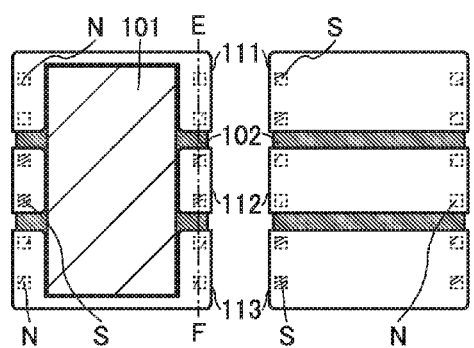　FIG. 4B2 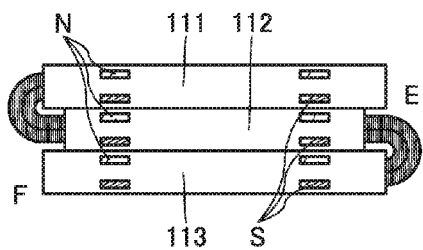
FIG. 4C1 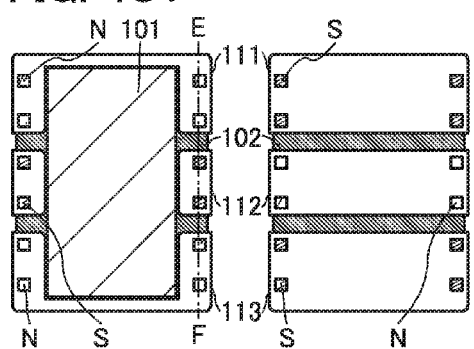　FIG. 4C2 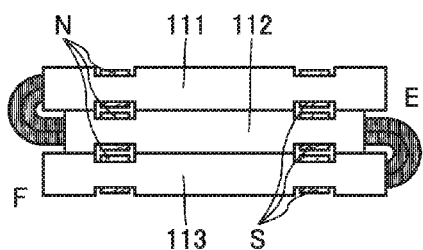

FIG. 5A1
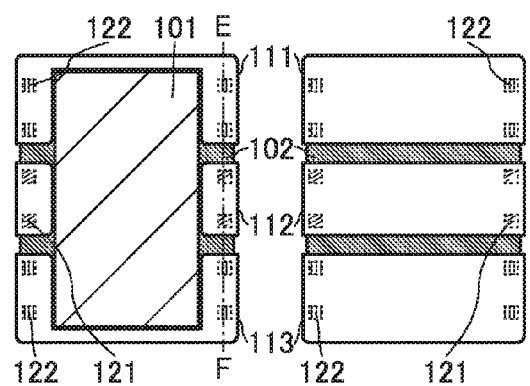
FIG. 5A2
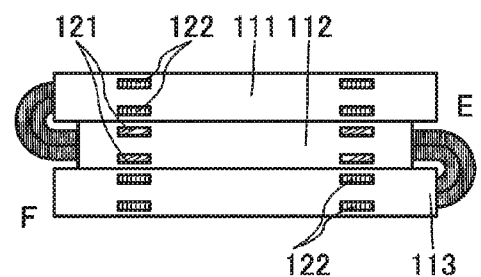
FIG. 5B1
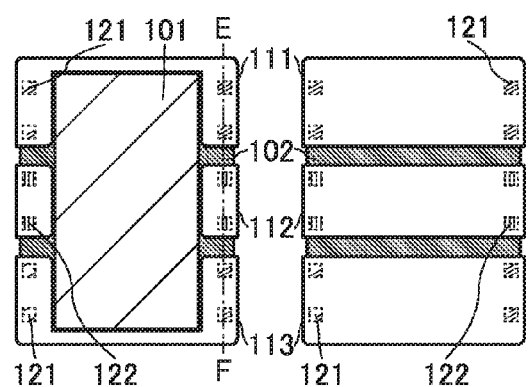
FIG. 5B2
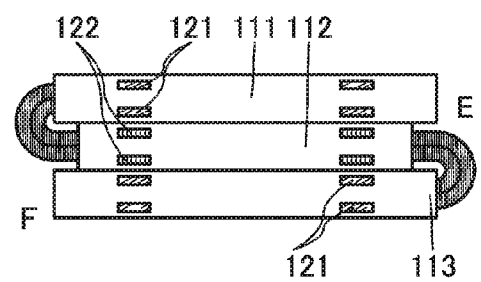

FIG. 18A1
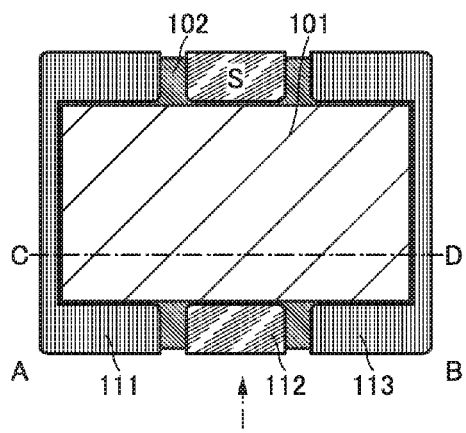
FIG. 18A2
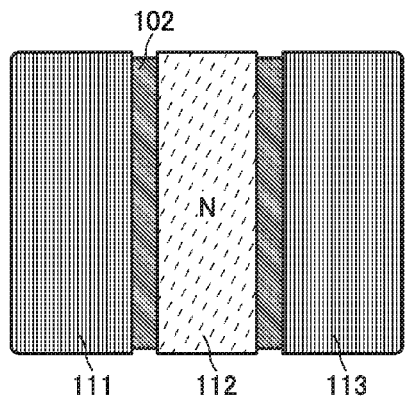
FIG. 18B1
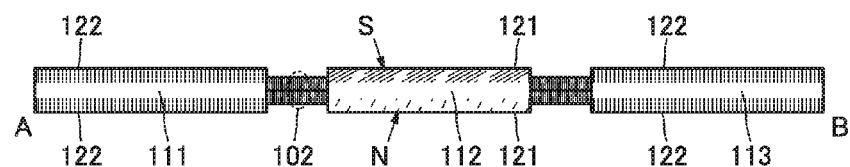
FIG. 18B2
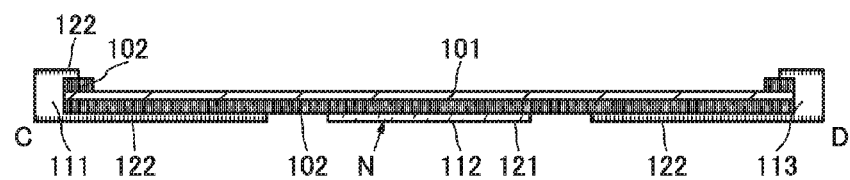
FIG. 18C
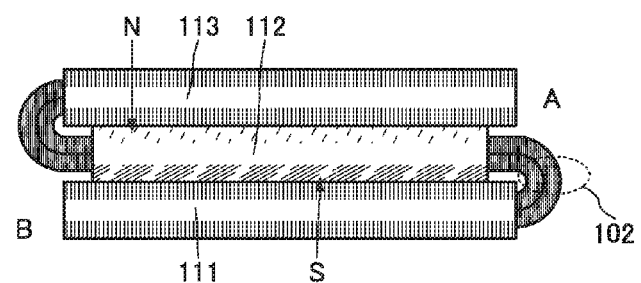

LIGHT-EMITTING DEVICE

BACKGROUND OF THE INVENTION

1. Field of the Invention

One embodiment of the present invention relates to a light-emitting device. In particular, one embodiment of the present invention relates to a light-emitting device using an electroluminescence (EL) phenomenon. Moreover, one embodiment of the present invention relates to a display device.

Note that one embodiment of the present invention is not limited to the above technical field. One embodiment of the invention disclosed in this specification and the like relates to an object, a method, or a manufacturing method. Moreover, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a storage device, an electronic device, a lighting device, an input device, an input-output device, a driving method thereof, and a manufacturing method thereof.

In this specification and the like, a semiconductor device generally means a device that can function by utilizing semiconductor characteristics. Each of a semiconductor element such as a transistor, a semiconductor circuit, an arithmetic device, and a memory device is one embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

2. Description of the Related Art

Recent light-emitting devices and display devices are expected to be applied to a variety of uses and become diversified.

For example, light-emitting devices and display devices for mobile devices and the like are required to be thin, lightweight, and less likely to be broken.

The light-emitting device using an EL phenomenon (also referred to as an EL element) is thinned and lightened easily because a backlight which is necessary for a liquid crystal display device is not needed. The EL element also has features of, for example, high-speed response to an input signal and driving with a direct-current low voltage source; therefore, its application to a light-emitting device and a display device has been proposed.

For example, Patent Document 1 discloses a flexible active matrix light-emitting device in which an organic EL element and a transistor serving as a switching element are provided over a film substrate.

REFERENCE

Patent Document

[Patent Document 1] Japanese Published Patent Application No. 2003-174153

SUMMARY OF THE INVENTION

In recent years, browsability of display has been improved by increasing the amount of data to be displayed with an increase of a display region of a display device. On the other hand, when mobile devices and the like with a large-sized display regions have low portability; thus, it is difficult to achieve improvement of display browsability and high portability together.

One object of one embodiment of the present invention is to provide a light-emitting device or the like having high portability. Another object thereof is to provide a light-emitting device or the like having high browsability. Another object thereof is to provide a light-emitting device or the like having high portability and browsability. Another object thereof is to provide a novel display device or the like.

Note that the descriptions of these objects do not disturb the existence of other objects. Note that in one embodiment of the present invention, there is no need to achieve all the objects. Objects other than the above objects will be apparent from and can be derived from the description of the specification and the like.

According to one embodiment of the present invention, a light-emitting device includes a flexible light-emitting panel and a plurality of housings that support the light-emitting panel. The plurality of housings are spaced from each other, and two of the plurality of housings which face each other when the light-emitting panel is folded are fixed to each other by magnetism.

It is preferable that each of the plurality of housings include a ferromagnet and that the ferromagnet be provided in each of the plurality of housings so that magnetic poles of an upper surface and a lower surface of the housing are opposite to each other and that magnetic poles of the upper surfaces of the two adjacent housings are opposite to each other.

Alternatively, the following structure is preferable: the plurality of housings are each any of a first housing including ferromagnets so that magnetic poles point to the upper surface and the lower surface of the housing and a second housing including a soft magnetic substance that might be magnetized by the ferromagnet. The first housings and the second housings are alternately disposed. The first housing and the second housing which face each other when the light-emitting panel is folded are fixed to each other by magnetism.

The soft magnetic substance preferably includes one or more selected from Fe, an Fe—Ni alloy, an Fe—Si—Al alloy, and an Fe—Co alloy.

The ferromagnet preferably includes one or more selected from an isotropic ferrite magnet, an anisotropic ferrite magnet, a neodymium magnet, a samarium cobalt magnet, and an alnico magnet.

In the case where the two housings which face each other are fixed to each other when the light-emitting panel is folded, adsorption power of the two housings is preferably greater than or equal to 0.1 kgf and less than or equal to 2.0 kgf.

In any of the above structures, the following structure is preferable: in the case where the light-emitting panel is folded so that the adjacent housings are alternately overlapped to each other, a specified housing between the two housings at ends of the plurality of housings can be reversibly modified into a first mode in which the light-emitting panel is folded so that the housing is located uppermost or a second mode in which the light-emitting panel is folded so that the housing is located lowermost.

Note that the light-emitting device in this specification includes, in its category, a light source (including a lighting device) or the like in addition to a display device using a light-emitting element. In addition, the light-emitting device might include any of the following modules in its category:

a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a substrate over which a light-emitting element is formed by a chip on glass (COG) method.

According to one embodiment of the present invention, a light-emitting device having high portability can be provided. Alternatively, a light-emitting device having high browsability can be provided. Further alternatively, a light-emitting device having high portability and browsability can be provided. Note that one embodiment of the present invention is not limited to these effects. For example, depending on circumstances or conditions, one embodiment of the present invention might produce another effect.

BRIEF DESCRIPTION OF THE DRAWINGS

FIGS. 3A1 and 3A2, 3B1 and 3B2, and 3C illustrate a structural example of a light-emitting device of an embodiment.

FIGS. 4A1 and 4A2, 4B1 and 4B2, and 4C1 and 4C2 illustrate structural examples of a light-emitting device of an embodiment.

FIGS. 5A1 and 5A2 and 5B1 and 5B2 illustrate structural examples of a light-emitting device of an embodiment.

FIGS. 18A1 and 18A2, 18B1 and 18B2, and 18C illustrate a structural example of a light-emitting device of an embodiment.

DETAILED DESCRIPTION OF THE INVENTION

Figure 1A:
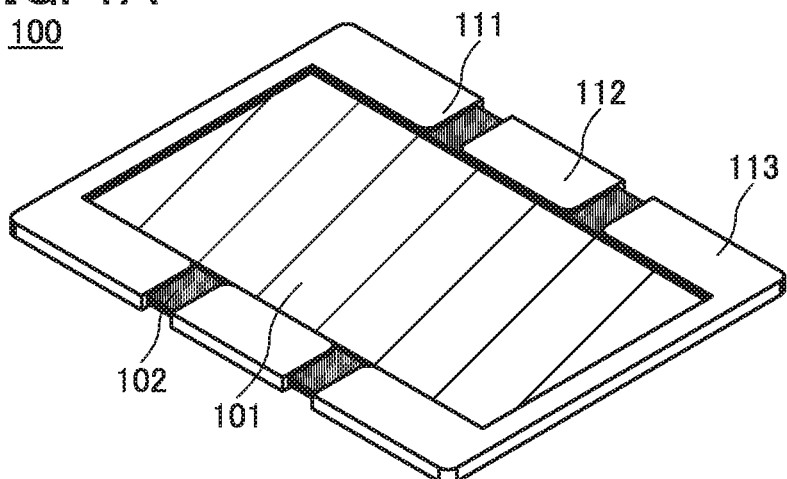
FIGS. 1A to 1C each illustrate a structural example of a light-emitting device of an embodiment.

Embodiments will be described in detail with reference to drawings. Note that the present invention is not limited to the description below, and it is easily understood by those skilled in the art that various changes and modifications can be made without departing from the spirit and scope of the present invention.

Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

In this embodiment, a light-emitting device of one embodiment of the present invention will be described with reference to drawings.

In a light-emitting device of one embodiment of the present invention, a flexible light-emitting panel is supported by a plurality of housings which are provided spaced from each other. In the light-emitting device, the light-emitting panel can be bent at a portion between the two adjacent housings. The light-emitting device can be folded by bending the light-emitting panel so that surfaces of adjacent housings face each other. A light-emitting device of one embodiment of the present invention is highly portable in a folded state, and has high browsability in display in an opened state because of a seamless large light-emitting region (display region).

Moreover, in the light-emitting device of one embodiment of the present invention, in which part or the whole of the housings have magnetism, the two adjacent housings can be fixed to each other by a magnetic force when the light-emitting device is used in a folded state. Therefore, a mechanical jig for fixing the housings is not necessary; therefore, the design can be simplified and the number of components can be reduced.

Since the two housings are fixed to each other by a magnetic force, gravitation is generated only when adjacent housings get close to each other by bending the light-emitting panel at a time when the light-emitting device is modified from the opened state to the folded state. Therefore, bending or twisting of the light-emitting panel in an unintentional direction when the light-emitting device is modified from the opened state to the folded state can be prevented; thus, damage of the light-emitting panel can be suppressed. On the other hand, for example, in a structure where two housings are fixed to each other with a fixing jig or the like after the light-emitting panel is bent by a user so that the housings are in contact with each other, the light-emitting panel that connects the two housings with each other might be damaged due to a curve with a curvature radius of the specification limit or lower or twisting of the light-emitting panel in an unintentional direction.

Moreover, the gravitation generated by magnetism is in inverse proportion to the square of the distance between two housings; therefore, when the light-emitting device is modified from the folded state to the opened state, the two housings can be easily separated from each other by inserting a finger or the like into a space between the two fixed housings to make a small gap therebetween. Therefore, an operation of separating the two housings by, for example, pulling the two fixed housings in the opposite directions is not needed. Accordingly, the light-emitting panel, which connects the two housings with each other, can be prevented from being damaged due to careless pulling of the housings.

In the light-emitting device of one embodiment of the present invention, the light-emitting panel can be bent either inward or outward.

Note that in this specification, "being bent inward" means being bent such that a light-emitting surface of a light-emitting panel faces inward, and "being bent outward" means being bent such that a light-emitting surface of a light-emitting panel faces outward. A light-emitting surface of a light-emitting panel or a light-emitting device refers to a surface through which light emitted from a light-emitting element is extracted.

When the light-emitting device of one embodiment of the present invention is bent such that a light-emitting surface of the light-emitting panel faces inward, the light-emitting surface can be prevented from being damaged or contaminated in carrying the light-emitting device. This is preferable, for example, in carrying the light-emitting device in a pocket of clothes or a bag.

When the light-emitting device of one embodiment of the present invention is in use, the seamless large light-emitting region is entirely used in an opened state, or the light-emitting region can be partly used by bending such that the light-emitting surface of the light-emitting panel faces outward. Inward folding of the light-emitting device can reduce the power consumption because part of the light-emitting region that is hidden from a user becomes a non-light-emitting region.

Structural Example

The following shows structural examples of a light-emitting device of one embodiment of the present invention. As an example, described below is a light-emitting device in which a flexible light-emitting panel is supported by three housings and is curved at two places so that the light-emitting device can be modified from the opened state to the three-folded state.

Figure 1B:
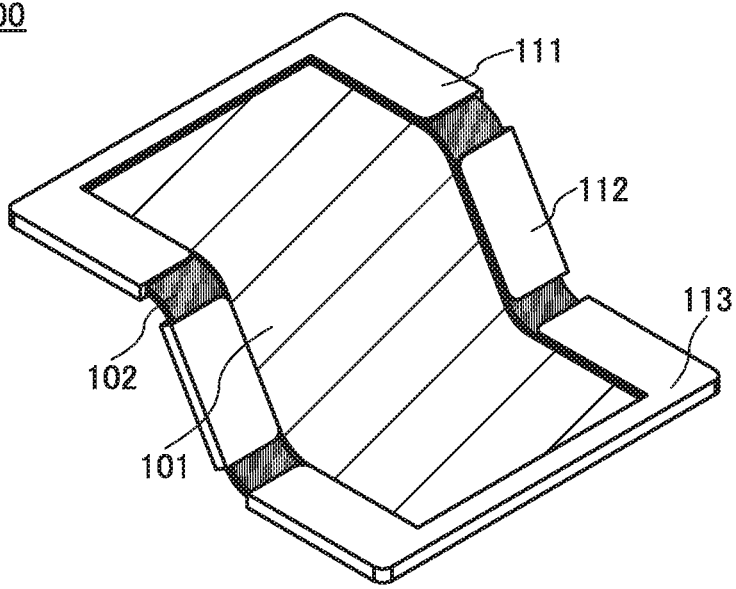
Figure 1C:
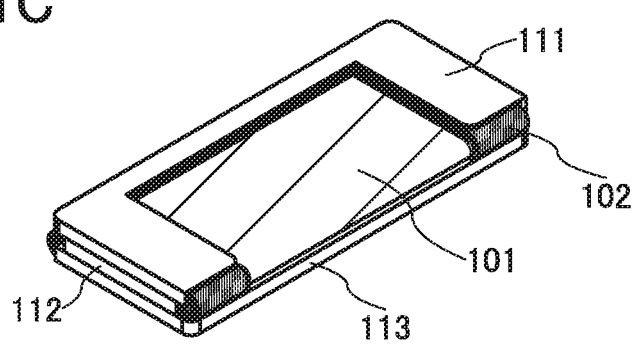
Figure 2:
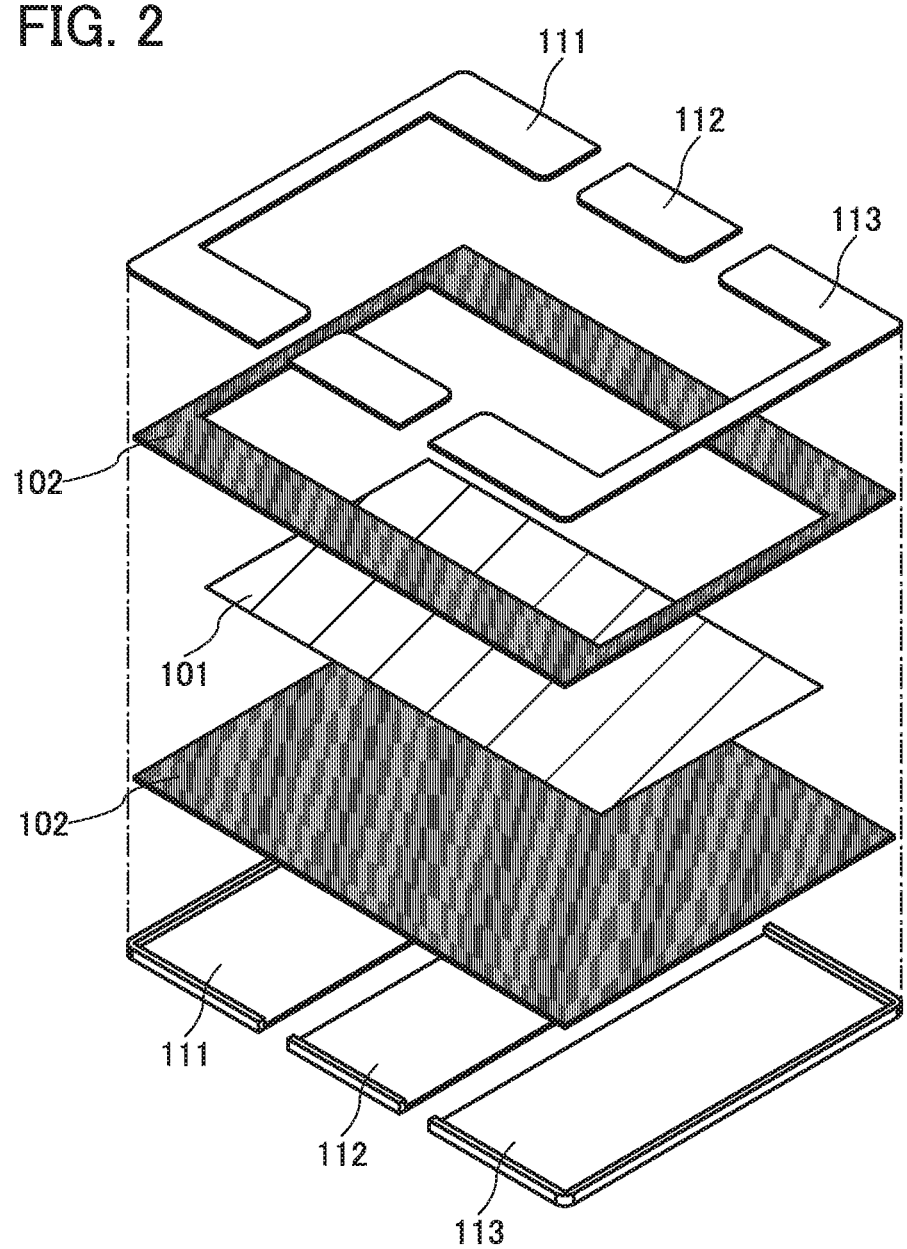
FIG. 2 illustrates a structural example of a light-emitting device of an embodiment.

FIG. 1A illustrates a light-emitting device 100 that is opened. FIG. 1B illustrates the light-emitting device 100 that is being opened or being folded. FIG. 1C illustrates the light-emitting device 100 that is folded. FIG. 2 is a development view illustrating components of the light-emitting device 100.

The light-emitting device 100 includes a flexible light-emitting panel 101. The light-emitting device 100 also includes a plurality of housings (housings 111, 112, and 113). The plurality of housings are separated from one another. Note that in the case of describing common points of the housings 111, 112, and 113 without distinguishing from one another, they are in some cases simply referred to as the housings.

Each housing may support the light-emitting panel 101 and may be provided on at least one of the light-emitting surface side and the side opposite to the light-emitting surface side (also referred to as a lower surface side or a rear surface side) of the light-emitting panel. FIGS. 1A to 1C and FIG. 2 illustrate an example of the housings that support the outer edge on the light-emitting surface side of the light-emitting panel 101 and the side opposite to the light-emitting surface side of the light-emitting panel 101. With the housings that support both sides of the light-emitting panel 101, the mechanical strength of the light-emitting panel 101 can be increased, whereby the light-emitting device 100 can be prevented from being damaged.

Each housing may have rigidity or may be formed with a member capable of being modified with respect to force such as bending and twisting. Each housing may be formed with a material having lower flexibility than at least the light-emitting panel 101, and an elastic body such as hard rubber may be used for a skeleton of the housing. Besides, as a material that constitutes each housing, plastic, a metal such as aluminum, an alloy such as stainless steel or a titanium alloy, rubber such as silicone rubber, or the like can be used.

In addition, as illustrated in FIGS. 1A to 1C and FIG. 2, it is preferable to provide a protective layer 102 that supports the side opposite to the light-emitting surface side of the light-emitting panel 101 and the outer edge on the light-emitting surface side thereof. Even in the case where the mechanical strength of the light-emitting panel 101 itself is low, the mechanical strength at a curved portion can be increased by the protective layer 102. Note that although here, the protective layer 102 is provided to entirely cover the light-emitting panel 101, the protective layer 102 may be provided in at least portions each between two housings, that is, a curved region. As illustrated in FIG. 2, the light-emitting panel 101 is sandwiched between the two protective layers 102 and is disposed so as to place at the center portion with respect to the thickness directions of the protective layers 102, whereby stress applied to the light-emitting panel 101 when the light-emitting panel 101 and the protective layers 102 are curved inward or outward can be suppressed to be as little as possible.

It is preferable that the protective layer 102 on the light-emitting surface side be provided with an opening overlapping with the light-emitting region of the light-emitting panel 101 and be provided to cover the peripheral portion of the light-emitting panel 101. Alternatively, the protective layer 102 provided with a light-transmitting member overlapping with the light-emitting region may be used. For example, when the protective layer 102 is provided so as to cover a wiring, a driver circuit, or the like positioned at an end portion of the light-emitting panel 101, the wiring, the driver circuit, or the like can be physically protected and the light-emitting panel 101 can be prevented from deteriorating because the wiring, the driver circuit, or the like is shielded from light. Furthermore, the wiring, the driver circuit, or the like can be prevented from being viewed in which case visual pleasure of the light-emitting device itself is impeded.

For example, plastic, rubber, a metal, an alloy, or the like can be used for the protective layer 102.

Plastic, rubber, a titanium alloy, or the like is preferably used for the protective layer 102 and the housing because the light-emitting device can be lightweight and less likely to be broken.

The protective layer 102 and the housing are preferably formed using a material with high toughness. Thus, a light-emitting device with high impact resistance that is less likely to be broken can be provided. For example, when an organic resin, a thin metal material, or a thin alloy material is used, the light-emitting device can be lightweight and less likely to be broken. For a similar reason, also a substrate of the light-emitting panel 101 is preferably formed using a material with high toughness.

The protective layer 102 and the housing on the light-emitting surface side do not necessarily have a light-transmitting property if they do not overlap with the light-emitting region of the light-emitting panel 101. When the protective layer 102 and the housing on the light-emitting surface side overlap with at least part of the light-emitting region, they are preferably formed using a material that transmits light emitted from the light-emitting panel 101. There is no limitation on the light-transmitting property of the protective layer 102 and the housing on the side opposite to the light-emitting surface side.

When any two of the protective layer 102, the housing, and the light-emitting panel 101 are bonded to each other, any of a variety of adhesives can be used. For example, a resin that is curable at room temperature such as a two-component-mixture-type resin, a light-curable resin, a thermosetting resin, or the like can be used. Alternatively, a sheet-like adhesive may be used. Alternatively, components of the light-emitting device may be fixed with, for example, a screw that penetrates two or more of the protective layer 102, the housing, and the light-emitting panel 101 or a pin or clip that holds them.

The light-emitting device of one embodiment of the present invention can be used with one light-emitting panel 101 (one light-emitting region) divided into two or more regions at a folded portion(s). For example, it is possible to put the region that is hidden by folding the light-emitting device in a non-light-emitting state and put only the exposed region in a light-emitting state. Thus, power consumed by a region that is not viewed by a user can be reduced.

The light-emitting device of one embodiment of the present invention may include a sensor for determining whether the light-emitting panel 101 located between the housings is curved or not. For example, the sensor can be composed of, for example, a switch, a MEMS pressure sensor, a pressure sensor, or the like.

In the light-emitting device of one embodiment of the present invention, a flexible touch sensor may be provided so as to overlap with the light-emitting panel 101. Preferably, the touch sensor is provided so that a detection surface of the touch sensor is located on the display surface side of the light-emitting panel 101. At this time, when the light-emitting panel 101 is bent, the detection surface of the touch sensor is preferably bent along a curved surface made by the display surface of the display panel 101.

Note that a touch panel that functions as a touch sensor may be used as the light-emitting panel 101.

By folding the light-emitting device 100 at a portion between the housings, the light-emitting device 100 can be reversibly modified from the developed state in FIG. 1A to the folded state in FIG. 1C through a state in FIG. 1B. At this time, the relative positions between the housing 111 and the housing 112 and between the housing 112 and the housing 113 are fixed by a magnetic force.

[Fixing Method of Housings by Magnetic Force]

Next, an example of a method for fixing the relative position of the housings by a magnetic force when the light-emitting device is folded is described.

FIG. 3A1 is a top view of the light-emitting device, and FIG. 3A2 is a rear view of the light-emitting device. FIG. 3B1 is a schematic side view of a range A-B when viewed in the direction indicated by an arrow in FIG. 3A1, and FIG. 3B2 is a schematic cross-sectional view taken along line C-D in FIG. 3A1. FIG. 3C is a schematic side view of the range A-B when viewed in the direction indicated by the arrow in FIG. 3A1 in a state where the light-emitting device is folded. Note that the thickness of the light-emitting panel 101 is exaggerated for clarity in FIG. 3B2.

The light-emitting device illustrated in FIGS. 3A1 to 3C includes the housings 111, 112, and 113 whose surfaces are magnetized. The upper surface and the lower surface of the housing are provided with ferromagnets, which are magnetized, so that magnetic poles of the upper surface and the lower surface of the housing are opposite to each other. Furthermore, the ferromagnets are magnetized so that magnetic poles of the upper surfaces of the two adjacent housings are opposite to each other. Therefore, the ferromagnets are similarly magnetized so that magnetic poles of the lower surfaces of the two adjacent housings are opposite to each other.

Note that in the following description, a surface of the housing on the light-emitting surface side is described as an upper surface and a surface thereof on the opposite side is described as a lower surface.

Here, as an example, the ferromagnets provided on the upper surface of the housing 111, the lower surface of the housing 112, and the upper surface of the housing 113 are magnetized to be N poles, and the ferromagnets provided on the lower surface of the housing 111, the upper surface of the housing 112, and the lower surface of the housing 113 are magnetized to be S poles. Needless to say, the N poles and S poles may be switched to each other.

With such a structure, as illustrated in FIG. 3C, magnetic poles of the lower surface of the housing 111 and the lower surface of the housing 112 (upward surfaces in FIG. 3C) that face each other when the light-emitting device is folded are opposite to each other; therefore, the two housings are attracted and fixed to each other. In a similar manner, with the upper surface of the housing 112 (a downward surface in FIG. 3C) and the upper surface of the housing 113, the two housings are fixed to each other by gravitation.

Here, as a ferromagnet, a material including an isotropic ferrite magnet, an anisotropic ferrite magnet, a neodymium magnet (Nd—Fe—B), a samarium cobalt magnet (Sm—Co), or an alnico magnet (Fe—Al—Ni—Co) can be used, for example. Moreover, as a ferromagnet, a rubber magnet in which a powdery magnet or the like is mixed into rubber, a plastic magnet in which a powdery magnet or the like is mixed into plastic, or the like may be used. Such a magnet is referred to as a bond magnet or a bonded magnet.

In particular, when the above bonded magnet is used in the case where the housing surfaces are magnetized, the weights of the housings can be reduced and the housings can be easily processed into arbitrary shapes. After such a material is used for the housings and is processed, the housing surfaces may be magnetized so that magnetic poles point to the housing surface in the above directions.

With such a structure in which the two adjacent housings are fixed to each other by two ferromagnets facing each other, the two ferromagnets are each influenced by their magnetic fields when the two housings are overlapped with each other; therefore, demagnetization of the ferromagnets influenced by the external magnetic field can be reduced in some cases.

Although the upper surfaces themselves of the housings are magnetized by providing the ferromagnets on the upper surfaces of the housings in the above example, a ferromagnet may be disposed inside the housing in the vicinity of the upper surface or the lower surface of the housing as illustrated in FIGS. 4A1 and 4A2. Here, FIG. 4A1 illustrates the top view and the rear view of the light-emitting device which corresponds to FIGS. 3A1 and 3A2, and FIG. 4A2 is a schematic cross-sectional view taken along line E-F in FIG. 4A1.

Note that for clarity, in FIG. 4A2, a ferromagnet disposed so that an N pole points in a direction perpendicular to the surface of a housing is denoted by N, and a ferromagnet disposed so that an S pole points in a direction perpendicular to the surface of a housing is denoted by S. The same material or a different material may be used for the ferromagnets as long as the magnetic poles are different.

At this time, a material having a low magnetic permeability is preferably used for the housings.

With such a structure, it is possible to use plastic, glass, ceramic, rubber, a metal or an alloy having a low magnetic permeability, or the like as materials of the housings, which is preferable because materials of the housings can be selected more freely.

As illustrated in FIGS. 4B1 and 4B2, a ferromagnet may be disposed in part of the housing instead of the whole of the housing. At this time, it is preferable to dispose two or more ferromagnets on one surface of a housing so that the ferromagnets are apart from each other. When two housings are provided so as to face each other, the ferromagnets provided for the housings are attracted to each other at two or more places, whereby the relative position of the two housings in a plane between the housing surfaces parallel to each other are fixed and accordingly two-dimensional positional deviation of the two housings can be solved effectively.

Moreover, in the case where ferromagnets are disposed in part of the housings, use of a material having high magnetic flux density (or residual magnetic flux density) for the ferromagnets is preferable to disposition of the ferromagnets on the entire surfaces of the housings because an area where the two ferromagnets face each other becomes small when the light-emitting device is folded.

Ferromagnets to be used may be selected in consideration of magnetic flux density of materials depending on an area where the two ferromagnets face each other and a distance between the two ferromagnets when the two housings are overlapped with each other. For example, the gravitation between the ferromagnets becomes stronger as the area where the two ferromagnets face each other gets larger or the distance between the two ferromagnets gets shorter; therefore, a material having low magnetic flux density can be used. In that case, the magnetic flux density of the ferromagnet may be less than 100 mT. Moreover, in the case where a ferromagnet having high magnetic flux density needs to be used, a ferromagnet having magnetic flux density of 100 mT or more, 200 mT or more, or 500 mT or more can be used, for example.

For example, when two housings are overlapped with each other, power necessary to separate the two housings is determined depending on the area where the ferromagnets face each other and magnetic flux density of each ferromagnet. It is preferable to determine as appropriate the material (magnetic flux density) of the ferromagnets disposed on the housing or the area where the two ferromagnets face each other so that power necessary to separate the two housings (also referred to as adsorption power) becomes greater than or equal to 0.1 kgf and less than or equal to 2.0 kgf, preferably greater than or equal to 0.2 kgf and less than or equal to 1.0 kgf. In such a range, the two housings can be surely fixed to each other when the light-emitting device is folded and the two housings can be easily separated from each other when the light-emitting device is developed. For example, when the adsorption power of the two housings is less than 0.05 kgf, the two housings might not be fixed surely. On the other hand, when the adsorption power of the two housings is greater than the upper limit of the above range, attracting force between the two housings is increased and it might be difficult to easily separate the two housings from each other.

As illustrated in FIGS. 4C1 and 4C2, a structure in which a recessed portion is provided on the housing surface and a ferromagnet is provided at the bottom of the recessed portion may be employed. When the two housings are thus overlapped with each other, the gravitation between the two ferromagnets can be increased because there is no member that constitutes a housing between the two ferromagnets facing each other. Moreover, with such a structure in which a position of the ferromagnet can be viewed by a user, it is possible to prevent a defect in which the two housings cannot be fixed to each other due to, for example, insertion of a material having high magnetic permeability between the two ferromagnets by mistake. Note that the recessed portion provided for the housing may be filled or covered with a material having lower magnetic permeability or a material having higher light-transmitting property than a member of the housing.

Modification Example 1

Although the position of the two housings are fixed to each other by providing the ferromagnets on the adjacent housings and utilizing a magnetic force between the two ferromagnets in the above example, one of the ferromagnets may be replaced with a soft magnetic substance.

In other words, the plurality of housings each may include a ferromagnet so that magnetic poles point to the upper surface and the lower surface of the housing or a soft magnetic substance that might be magnetized by the ferromagnet. The housings including the ferromagnet and the housings including the soft magnetic substance may be alternately disposed.

FIGS. 5A1 and 5A2 illustrate the structure in FIGS. 4B1 and 4B2 in which the ferromagnets in the housings 111 and 113 are replaced with soft magnetic substances 122. At this time, the direction of a magnetic pole of the ferromagnet provided for the housing 112 is not limited; therefore, the ferromagnet is illustrated with the same hatching pattern as a ferromagnet 121.

As a material of the soft magnetic substance 122, a material having high magnetic permeability can be used; for example, a material including a soft magnetic substance such as Fe, an Fe—Ni alloy, an Fe—Si—Al alloy, or an Fe—Co alloy can be used.

Under ideal conditions, attracting force between the ferromagnet and the soft magnetic substance is almost half attracting force between two ferromagnets. Therefore, a material used for the ferromagnet preferably has higher magnetic flux density than a material used for a pair of ferromagnets described above.

Note that although FIGS. 5A1 and 5A2 illustrate the structure in FIGS. 4B1 and 4B2 in which the ferromagnets in the housings 111 and 113 are replaced with the soft magnetic substances 122, one embodiment of the present invention is not limited thereto. For example, as illustrated in FIGS. 5B1 and 5B2, the ferromagnets in the housing 112 may be replaced with the soft magnetic substances 122. Alternatively, the ferromagnet in one housing of the adjacent housings in the structure illustrated in FIGS. 3A1 to 3C or another structure in FIGS. 4A1 to 4C2 may be replaced with the soft magnetic substance 122 as illustrated in FIGS. 18A1 to 18C. Further alternatively, when a mixture of the ferromagnet 121 and the soft magnetic substance 122 is provided for one housing and the two adjacent housings are overlapped with each other, the ferromagnet 121 and the soft magnetic substance 122 may be disposed so as to face each other.

Instead of the soft magnetic substance 122, a soft magnetic substance material may be used for part of a region of the surface or the vicinity of the surface of the housing.

Modification Example 2

Although the ferromagnets and the soft magnetic substances are disposed along the upper surface or the lower surface of the housing in the above example, they may be provided at the side of the housing.

Figure 6A:
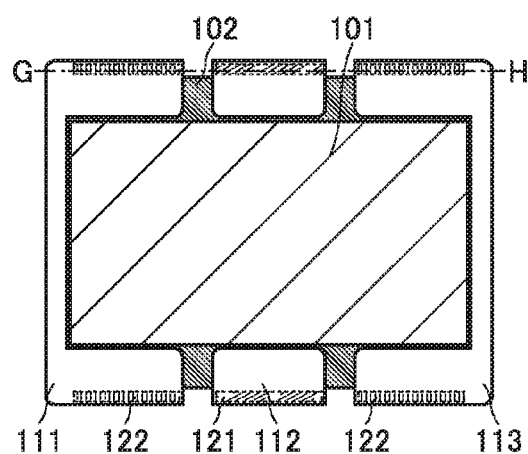
FIGS. 6A to 6C illustrate a structural example of a light-emitting device of an embodiment.
Figure 6B:
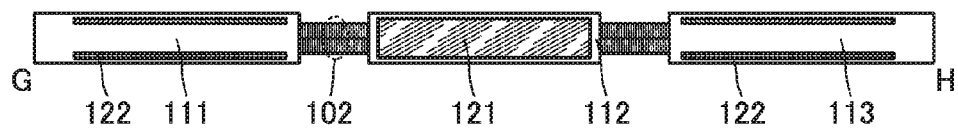
Figure 6C:
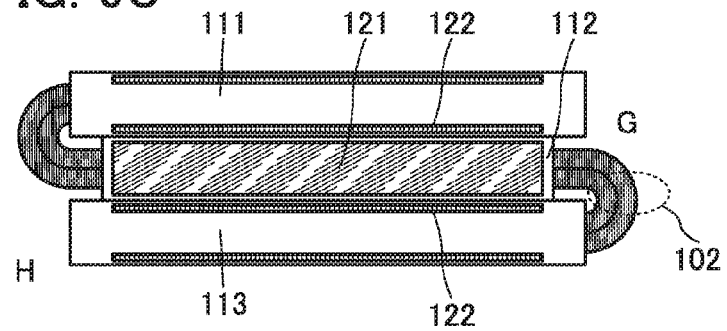

FIGS. 6A to 6C illustrate a structural example of a light-emitting device described below. FIG. 6A is a schematic top view in a developed state of the light-emitting device, FIG. 6B is a schematic cross-sectional view taken along line G-H in FIG. 6A, and FIG. 6C is a schematic cross-sectional view in a folded state of the light-emitting device.

In the structure illustrated in FIGS. 6A to 6C, the ferromagnet 121 is disposed inside the housing 112 along the side surface of the housing 112 (a surface perpendicular to the light-emitting surface of the light-emitting panel 101).

When the light-emitting device is folded as illustrated in FIG. 6C, the soft magnetic substance 122 is disposed on the housings 111 and 113 overlapping with the ferromagnet 121 in the housing 112.

Note that at least one of the ferromagnet 121 and the soft magnetic substance 122 may be exposed to the outside of the housings.

At this time, the magnetic poles of the ferromagnet 121 are preferably aligned in a direction perpendicular to the light-emitting surface. The magnetic poles of the ferromagnet 121 are preferably aligned in a direction perpendicular to the light-emitting surface, in which case the attracting force between the ferromagnet 121 and the soft magnetic substance 122 is increased. On the other hand, when the attracting force between the ferromagnet 121 and the soft magnetic substance 122 are too high, the direction of the magnetic poles of the ferromagnet 121 is deviated from the direction perpendicular to the light-emitting surface, so that the attracting force can be controlled to be low.

By thus disposing the ferromagnet 121 in the vicinity of the side surface of the housing, the thickness of the housing can be drastically reduced as compared with the case where the two ferromagnets 121 are disposed along the upper surface and the lower surface of the housing. In the light-emitting device of one embodiment of the present invention which can be particularly used in a folded state, a reduction in the thickness of the housing leads to a reduction in the thickness in the folded state; therefore, portability of the light-emitting device can be further improved.

Note that although the ferromagnet 121 is provided here for the housing 112, the ferromagnet 121 may be provided for the housings 111 and 113 and a soft magnetic substance may be provided for the housing 112. Alternatively, the ferromagnet 121 may be provided in the vicinities of the side surfaces of the three housings so that magnetic poles of the three housings are opposite to each other when the light-emitting device is folded.

The above is the description of the modification examples.

In any of the above light-emitting devices of embodiments of the present invention, in common, even when a portion of the light-emitting panel 101 between two housings is bent either inward or outward, the two housings can be fixed to each other by a magnetic force.

Figure 7:
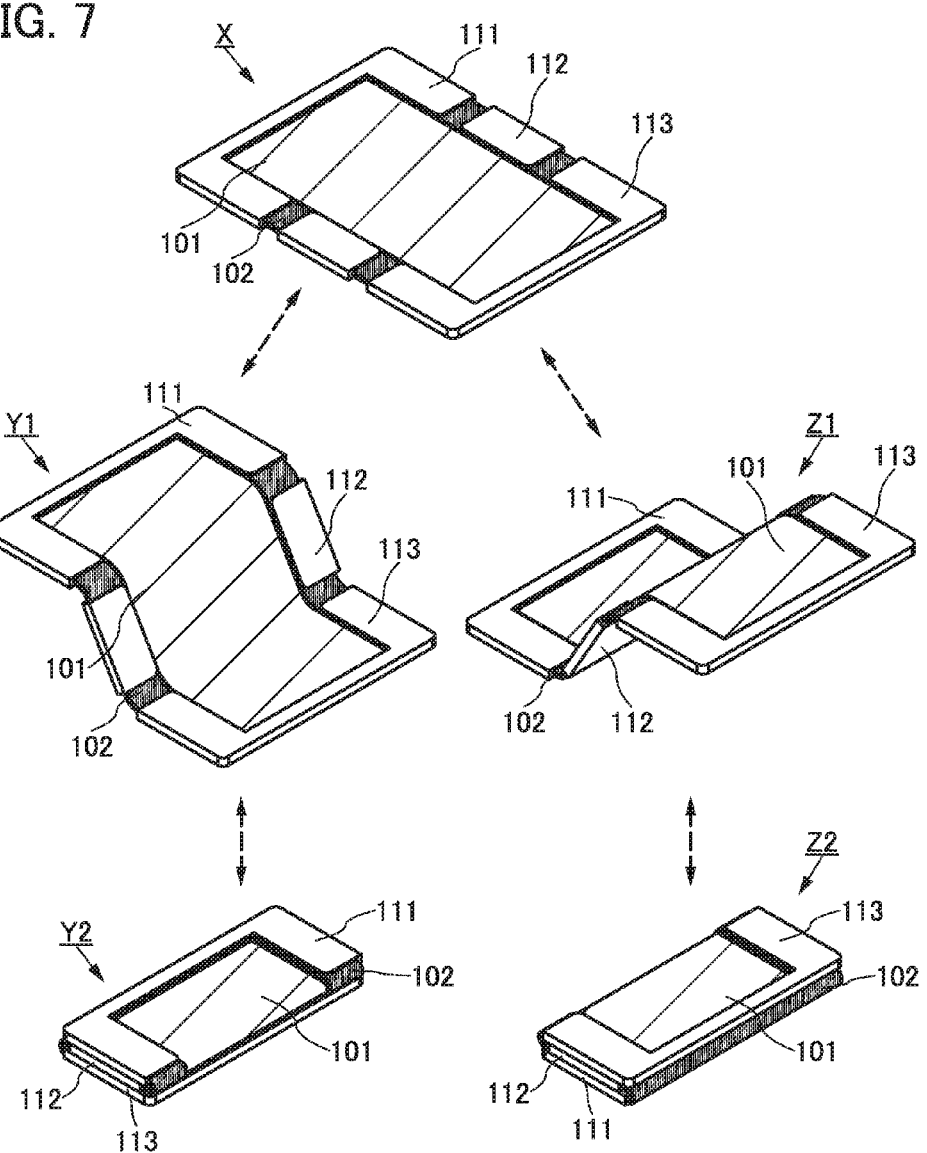
FIG. 7 illustrates a structural example of a light-emitting device of an embodiment.

Therefore, as illustrated in, for example, FIG. 7, a mode X in a developed state of the light-emitting device as a starting point can be reversibly modified into a mode Y2 in which the housing 111 is located uppermost and the housing 113 is located lowermost through a mode Y1 in which a portion between the housing 111 and the housing 112 is bent outward and a portion between the housing 112 and the housing 113 is bent inward. On the other hand, the mode X as a starting point can be reversibly modified into a mode Z2 in which the housing 111 is located lowermost and the housing 113 is located uppermost through a mode Z1 in which the portion between the housing 111 and the housing 112 is bent inward and the portion between the housing 112 and the housing 113 is bent outward.

Here, in either the mode Y2 or the mode Z2 in FIG. 7, the relative position of the two adjacent housings is fixed by a magnetic force.

In other words, in the case where the light-emitting panel of the light-emitting device of one embodiment of the present invention is folded so that the adjacent housings are alternately overlapped to each other, a specified housing between the two housings at ends of the plurality of housings can be reversibly modified into a state in which the light-emitting panel is folded so that the housing is located uppermost or a state in which the light-emitting panel is folded so that the housing is located lowermost.

Figure 16A:
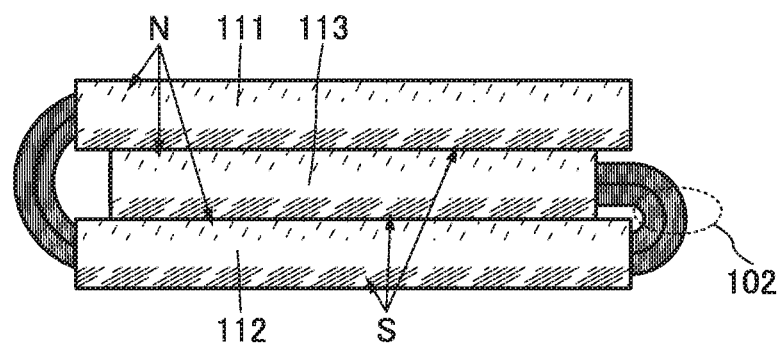
FIGS. 16A and 16B each illustrate a structural example of a light-emitting device of an embodiment.
Figure 16B:
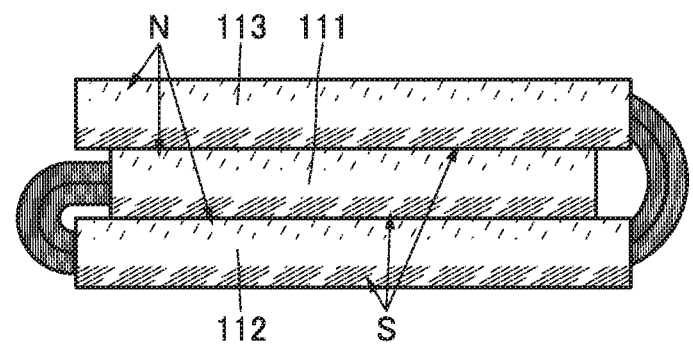

Note that one embodiment of the present invention is not limited to this structure. All display panels may be bent inward and the plurality of housings may be fixed. For example, FIGS. 16A and 16B illustrate an example of the structure in FIG. 3C in which the plurality of housings are fixed so that all the display panels are bent inward. Even in the case of bending all the display panels inward like this or bending all them outward, the light-emitting device can be appropriately fixed because the directions of the magnetic poles of the ferromagnets accord with each other.

Note that in the case where a display device is not used (in the case where an image is not displayed), all the display panels are preferably bent inward and fixed as illustrated in FIGS. 16A and 16B. Accordingly, the display device can be protected from damage because the upper surface of the display device is not exposed.

Therefore, even when the light-emitting device is put in a bag or a pocket, it can be put in a compact way. Moreover, in the case where the display device is used, display can be made even in a folded state by fixing the display panels as illustrated in FIG. 3C. Note that one embodiment of the present invention is not limited thereto.

Figure 8A:
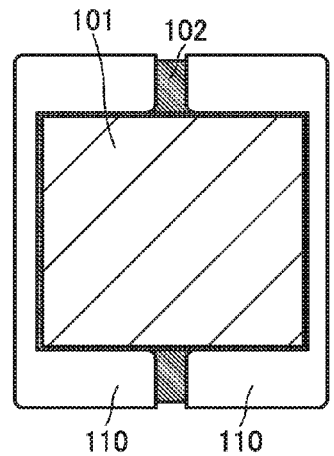
FIGS. 8A to 8C each illustrate a structural example of a light-emitting device of an embodiment.
Figure 8B:
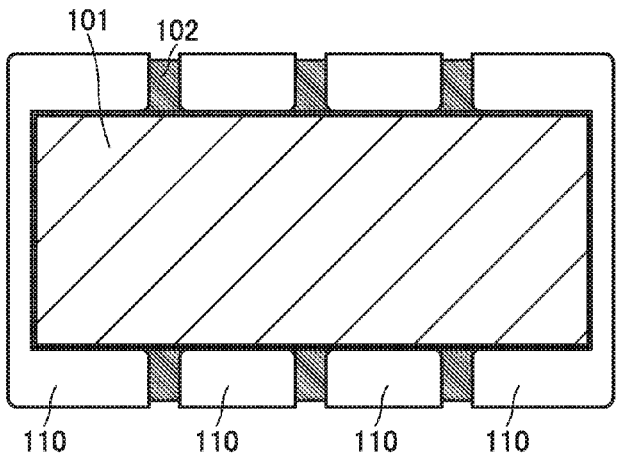
Figure 8C:
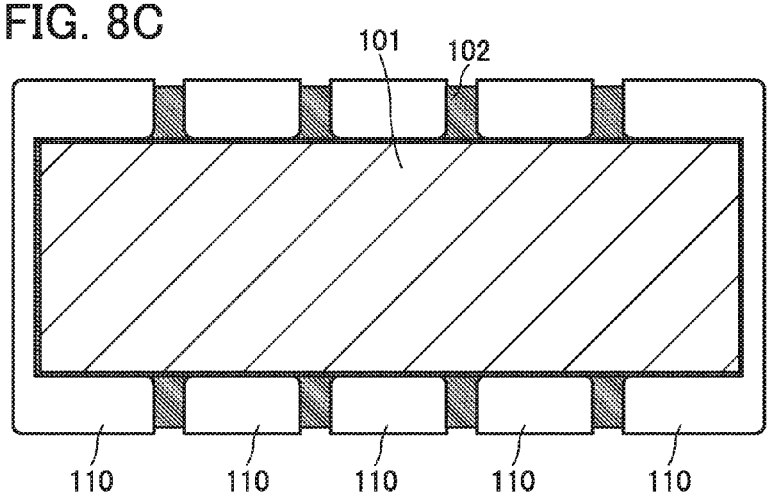

Note that although examples in which the three-foldable light-emitting device including the three housings are described above, the number of housings is not limited thereto. For example, each of a two-foldable light-emitting device including two housings 110 illustrated in FIG. 8A, a four-foldable light-emitting device including four housings 110 illustrated in FIG. 8B, and a five-foldable light-emitting device including five housings 110 illustrated in FIG. 8C is also one embodiment of the present invention. Alternatively, the number of housings 110 may be six or more.

Although the structure in which the portions between the two housings are connected to each other by the protective layers 102 is described above, the portions between the two housings may be mechanically connected to each other by hinges. Relative movable ranges of the portions between the two housings can be controlled by hinges; therefore, the light-emitting panel 101 can be prevented from being broken.

Electronic components, for example, a battery, a printed circuit board on which various ICs such as an arithmetic unit and a driver circuit are mounted, a wireless receiver, a wireless transmitter, a wireless power reception, and various sensors such as an acceleration sensor are incorporated, as appropriate, into housing of the light-emitting device of one embodiment of the present invention, so that the light-emitting device can function as an electronic device such as a portable terminal, a portable image reproducing device, or a portable lighting device. At this time, each electronic component may be collectively provided for any one of the plurality of housings. Alternatively, electric components may be dispersively provided for the plurality of housings to electrically connect the electronic components in the plurality of housings to each other by a wiring sandwiched between the protective layers 102 or a wiring or the like provided in the protective layer 102. Further alternatively, various input/output terminals including a camera, a speaker, and a power supply potential; various sensors including an optical sensor and the like; an operation button; or the like may be incorporated into the housing of the light-emitting device.

Although the thicknesses of the plurality of housings illustrated in the drawings are almost the same in the above drawings, the thickness of each housing may be different without limitation thereto. It is preferable that the thicknesses of two or more housings, preferably the thicknesses of all the housings be almost the same, in which case horizontally of the light-emitting surface in the developed state of the light-emitting device can be held easily. Alternatively, one of the plurality of housings is used as a main body having a relative large thickness in which all or most of the above electronic components are collectively provided for the housing and the other housings having lower thicknesses are used as members for supporting the light-emitting panel 101.

Note that an example in which the light-emitting element is used as a display element is illustrated, one embodiment of the present invention is not limited to such an example.

For example, in this specification and the like, a display element, a display device which is a device including a display element, a light-emitting element, and a light-emitting device which is a device including a light-emitting element can employ various modes or can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of a display device having an EL element include an EL display and the like. Display devices having electron emitters include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having an electronic ink or electrophoretic element include electronic paper.

For example, in this specification and the like, an active matrix method in which an active element is included in a pixel or a passive matrix method in which an active element is not included in a pixel can be used.

In the active matrix method, as an active element (a non-linear element), not only a transistor but also various active elements (non-linear elements), for example, a MIM (metal insulator metal), a TFD (thin film diode), or the like can be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

Note that as a method other than an active matrix method, a passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

At least part of this embodiment can be implemented as appropriate in combination with any of the other embodiments described in this specification.

Embodiment 2

In this embodiment, a light-emitting panel will be described with reference to drawings.

Specific Example 1

Figure 9A:
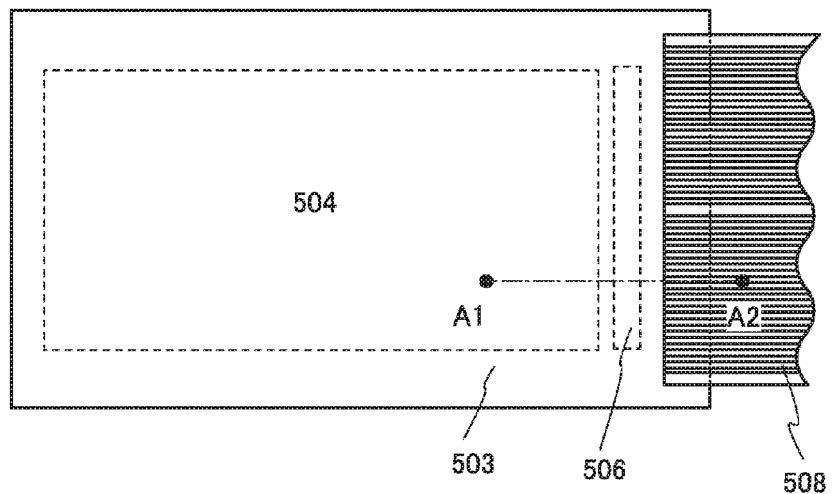
FIGS. 9A and 9B illustrate a light-emitting panel of an embodiment.
Figure 9B:
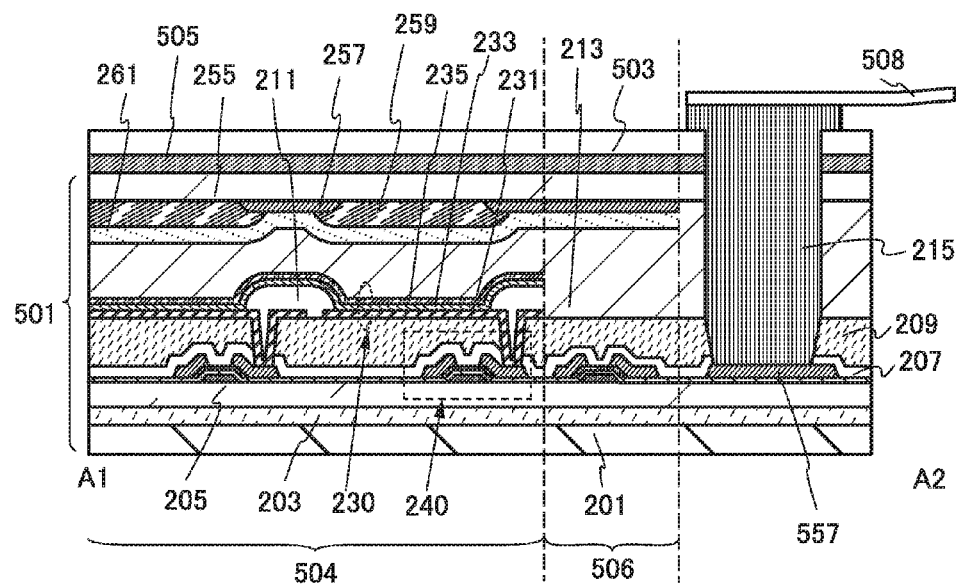

FIG. 9A is a plan view of the light-emitting panel 101 described as an example in Embodiment 1, and FIG. 9B is an example of a cross-sectional view taken along dashed-dotted line A1-A2 in FIG. 9A.

The light-emitting panel illustrated in FIG. 9B includes an element layer 501, a bonding layer 505, and a substrate 503. The element layer 501 includes a substrate 201, a bonding layer 203, an insulating layer 205, a plurality of transistors, a conductive layer 557, an insulating layer 207, an insulating layer 209, a plurality of light-emitting elements, an insulating layer 211, a sealing layer 213, an insulating layer 261, a coloring layer 259, a light-blocking layer 257, and an insulating layer 255.

The conductive layer 557 is electrically connected to an FPC 508 via a connector 215.

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the insulating layer 261. The space between the light-emitting element 230 and the insulating layer 261 is filled with the sealing layer 213.

The light-emitting panel includes a plurality of transistors in a light extraction portion 504 and a driver circuit portion 506. The transistor 240 is provided over the insulating layer 205. The insulating layer 205 and the substrate 201 are attached to each other with the bonding layer 203. The insulating layer 255 and the substrate 503 are attached to each other with the bonding layer 505. It is preferable to use films with low water permeability for the insulating layer 205 and the insulating layer 255, in which case an impurity such as water can be prevented from entering the light-emitting element 230 or the transistor 240, leading to improved reliability of the light-emitting panel. The bonding layer 203 can be formed using a material similar to that of the bonding layer 505.

The light-emitting panel in Specific Example 1 can be manufactured in the following manner: the insulating layer 205, the transistor 240, and the light-emitting element 230 are formed over a formation substrate with high heat resistance; the formation substrate is separated; and the insulating layer 205, the transistor 240, and the light-emitting element 230 are transferred to the substrate 201 and attached thereto with the bonding layer 203. The light-emitting panel in Specific Example 1 can be manufactured in the following manner: the insulating layer 255, the coloring layer 259, and the light-blocking layer 257 are formed over a formation substrate with high heat resistance; the formation substrate is separated; and the insulating layer 255, the coloring layer 259, and the light-blocking layer 257 are transferred to the substrate 503 and attached thereto with the bonding layer 505.

In the case where a material with high water permeability and low heat resistance (e.g., resin) is used for a substrate, it is impossible to expose the substrate to high temperature in the manufacturing process. Thus, there is a limitation on conditions for forming a transistor and an insulating film over the substrate. In the manufacturing method of this embodiment, a transistor and the like can be formed over a formation substrate with high heat resistance; thus, a highly reliable transistor and an insulating film with sufficiently low water permeability can be formed. Then, the transistor and the insulating film are transferred to the substrate 503 and the substrate 201, whereby a highly reliable light-emitting panel can be manufactured. Thus, according to one embodiment of the present invention, a thin and/or lightweight and highly reliable light-emitting device can be provided. Details of the manufacturing method will be described later.

The substrate 503 and the substrate 201 are each preferably formed using a material with high toughness. In that case, a display device with high impact resistance that is less likely to be broken can be provided. For example, when the substrate 503 is an organic resin substrate and the substrate 201 is a substrate formed using a thin metal material or a thin alloy material, the light-emitting panel can be more lightweight and less likely to be broken as compared with the case where a glass substrate is used.

A metal material and an alloy material, which have high thermal conductivity, are preferable because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

Furthermore, when a material with high thermal emissivity is used for the substrate 201, the surface temperature of the light-emitting panel can be prevented from rising, leading to prevention of breakage or a decrease in reliability of the light-emitting panel. For example, the substrate 201 may have a stacked-layer structure of a metal substrate and a layer with high thermal emissivity (e.g., the layer can be formed using a metal oxide or a ceramic material).

Specific Example 2

Figure 10A:
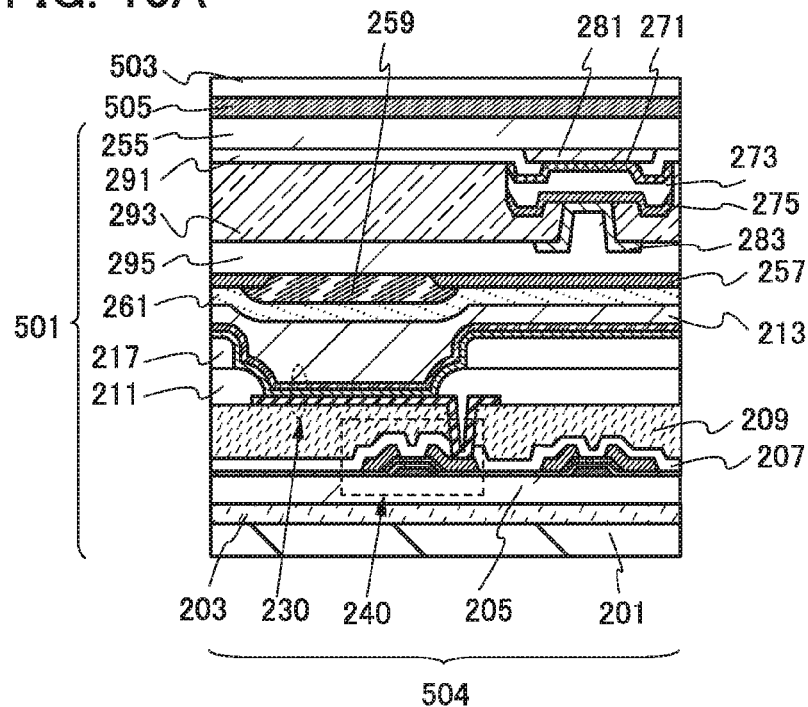
FIGS. 10A and 10B each illustrate a light-emitting panel of an embodiment.

FIG. 10A illustrates another example of the light extraction portion 504 in the light-emitting panel. The light-emitting panel illustrated in FIG. 10A is capable of touch operation. In the following specific examples, description of components similar to those in Specific Example 1 is omitted.

The light-emitting panel illustrated in FIG. 10A includes the element layer 501, the bonding layer 505, and the substrate 503. The element layer 501 includes the substrate 201, the bonding layer 203, the insulating layer 205, a plurality of transistors, the insulating layer 207, the insulating layer 209, a plurality of light-emitting elements, the insulating layer 211, an insulating layer 217, the sealing layer 213, the insulating layer 261, the coloring layer 259, the light-blocking layer 257, a plurality of light-receiving elements, a conductive layer 281, a conductive layer 283, an insulating layer 291, an insulating layer 293, an insulating layer 295, and the insulating layer 255.

Specific Example 2 includes the insulating layer 217 over the insulating layer 211. The space between the substrate 503 and the substrate 201 can be adjusted with the insulating layer 217.

FIG. 10A illustrates an example in which a light-receiving element is provided between the insulating layer 255 and the sealing layer 213. Since the light-receiving element can be placed to overlap with a non-light-emitting region (e.g., a region where the transistor 240 or a wiring is provided) on the substrate 201 side, the light-emitting panel can be provided with a touch sensor without a decrease in the aperture ratio of a pixel (light-emitting element).

As the light-receiving element included in the light-emitting panel, for example, a p-n photodiode or a p-i-n photodiode can be used. In this embodiment, a pin photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1 \times 10^{20}$ atoms/cm$^3$ or less and which has photoconductivity 100 times or more as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 overlaps with the light-receiving element on the side close to the substrate 503. The light-blocking layer 257 between the light-receiving element and the sealing layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the substrate 503 and the sealing layer 213 because the optical touch sensor is less likely to be affected by light emitted from the light-emitting element 230 and can have improved S/N ratio.

Specific Example 3

Figure 10B:
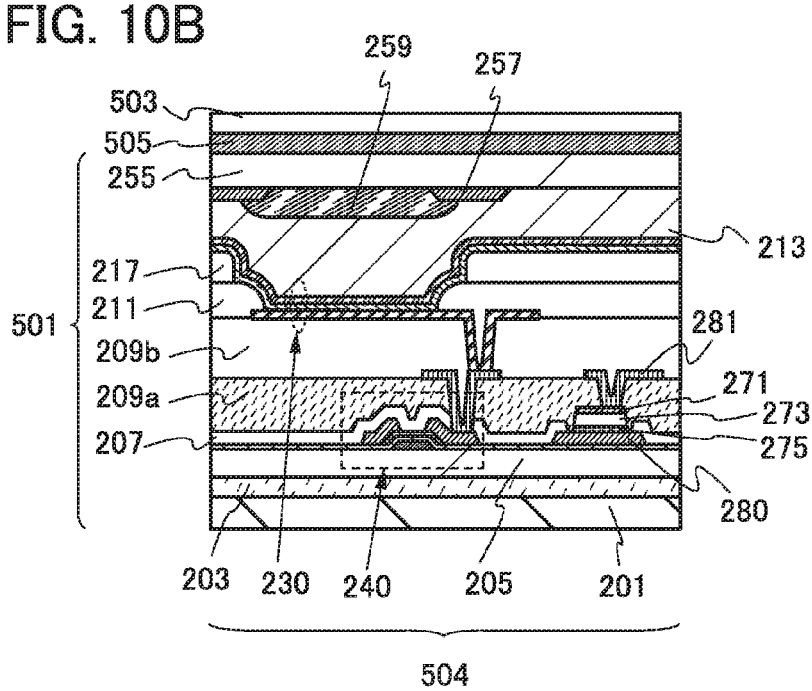

FIG. 10B illustrates another example of the light extraction portion 504 in the light-emitting panel. The light-emitting panel illustrated in FIG. 10B is capable of touch operation.

The light-emitting panel illustrated in FIG. 10B includes the element layer 501, the bonding layer 505, and the substrate 503. The element layer 501 includes the substrate 201, the bonding layer 203, the insulating layer 205, the plurality of transistors, the insulating layer 207, an insulating layer 209a, an insulating layer 209b, the plurality of light-emitting elements, the insulating layer 211, the insulating layer 217, the sealing layer 213, the coloring layer 259, the light-blocking layer 257, the plurality of light-receiving elements, a conductive layer 280, the conductive layer 281, and the insulating layer 255.

FIG. 10B illustrates an example in which a light-receiving element is provided between the insulating layer 205 and the sealing layer 213. Since the light-receiving element is provided between the insulating layer 205 and the sealing layer 213, a conductive layer to which the light-receiving element is electrically connected and a photoelectric conversion layer included in the light-receiving element can be formed using the same materials and the same steps as a conductive layer and a semiconductor layer included in the transistor 240. Thus, the light-emitting panel capable of touch operation can be manufactured without a significant increase in the number of manufacturing steps.

Specific Example 4

Figure 11A:
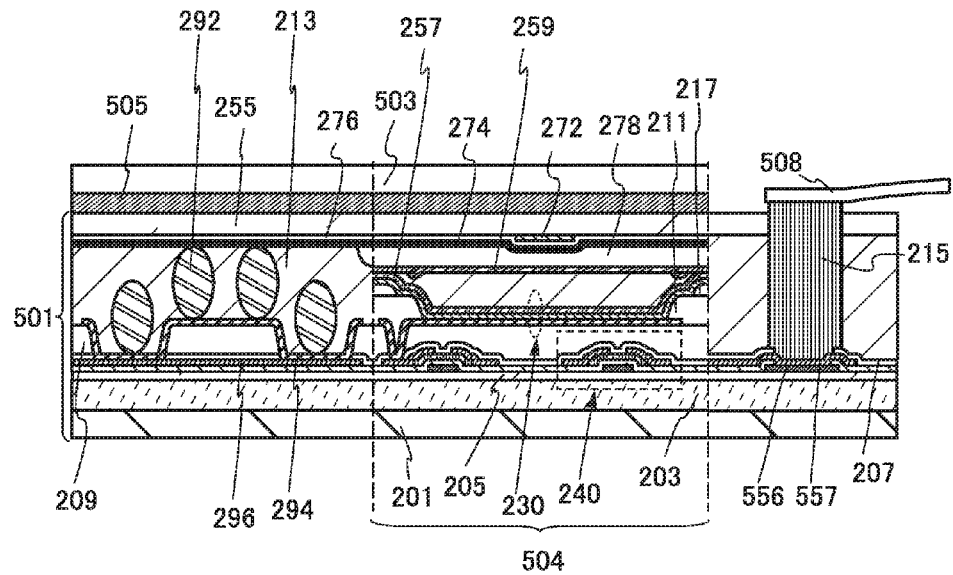
FIGS. 11A and 11B each illustrate a light-emitting panel of an embodiment.

FIG. 11A illustrates another example of the light-emitting panel. The light-emitting panel illustrated in FIG. 11A is capable of touch operation.

The light-emitting panel illustrated in FIG. 11A includes the element layer 501, the bonding layer 505, and the substrate 503. The element layer 501 includes the substrate 201, the bonding layer 203, the insulating layer 205, the plurality of transistors, a conductive layer 556, the conductive layer 557, the insulating layer 207, the insulating layer 209, the plurality of light-emitting elements, the insulating layer 211, the insulating layer 217, the sealing layer 213, the coloring layer 259, the light-blocking layer 257, the insulating layer 255, a conductive layer 272, a conductive layer 274, an insulating layer 276, an insulating layer 278, a conductive layer 294, and a conductive layer 296.

FIG. 11A illustrates an example in which a capacitive touch sensor is provided between the insulating layer 255 and the sealing layer 213. The capacitive touch sensor includes the conductive layer 272 and the conductive layer 274.

The conductive layer 556 and the conductive layer 557 are electrically connected to the FPC 508 via the connector 215. The conductive layer 294 and the conductive layer 296 are electrically connected to the conductive layer 274 via conductive particles 292. Thus, the capacitive touch sensor can be driven via the FPC 508.

Specific Example 5

Figure 11B:
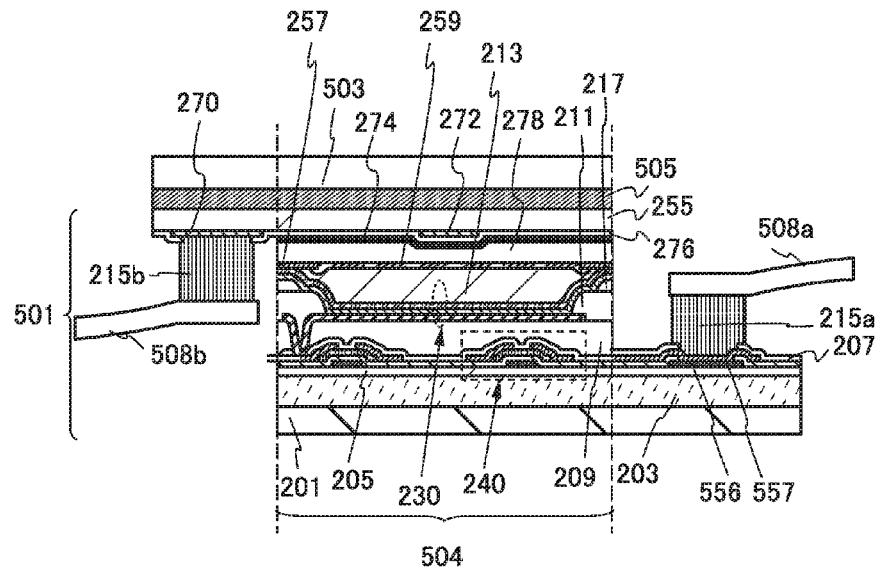

FIG. 11B illustrates another example of the light-emitting panel. The light-emitting panel illustrated in FIG. 11B is capable of touch operation.

The light-emitting panel illustrated in FIG. 11B includes the element layer 501, the bonding layer 505, and the substrate 503. The element layer 501 includes the substrate 201, the bonding layer 203, the insulating layer 205, the plurality of transistors, the conductive layer 556, the conductive layer 557, the insulating layer 207, the insulating layer 209, the plurality of light-emitting elements, the insulating layer 211, the insulating layer 217, the sealing layer 213, the coloring layer 259, the light-blocking layer 257, the insulating layer 255, a conductive layer 270, the conductive layer 272, the conductive layer 274, the insulating layer 276, and the insulating layer 278.

FIG. 11B illustrates an example in which a capacitive touch sensor is provided between the insulating layer 255 and the sealing layer 213. The capacitive touch sensor includes the conductive layer 272 and the conductive layer 274.

The conductive layer 556 and the conductive layer 557 are electrically connected to an FPC 508a via a connector 215a. The conductive layer 270 is electrically connected to an FPC 508b via a connector 215b. Thus, the light-emitting element 230 and the transistor 240 can be driven via the FPC 508a, and the capacitive touch sensor can be driven via the FPC 508b.

Specific Example 6

Figure 12A:
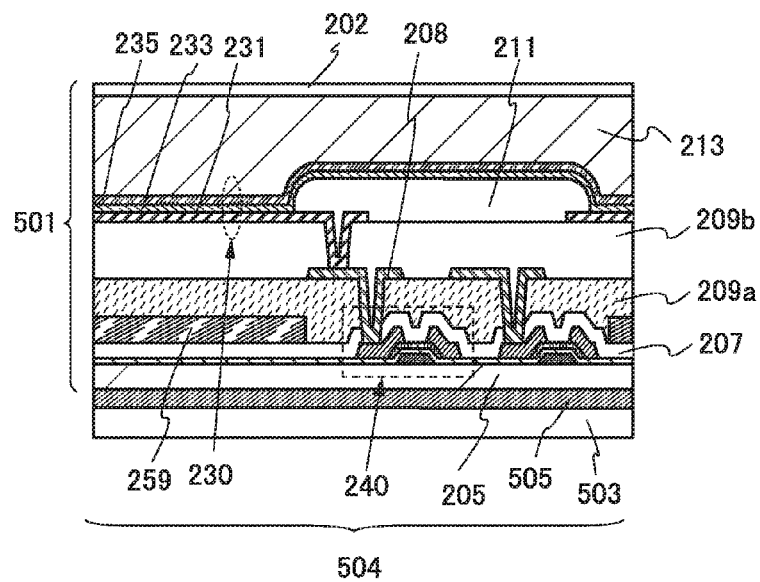
FIGS. 12A and 12B illustrate a light-emitting panel of an embodiment.

FIG. 12A illustrates another example of the light extraction portion 504 in the light-emitting panel.

The light extraction portion 504 illustrated in FIG. 12A includes the substrate 503, the bonding layer 505, a substrate 202, the insulating layer 205, the plurality of transistors, the insulating layer 207, a conductive layer 208, the insulating layer 209a, the insulating layer 209b, the plurality of light-emitting elements, the insulating layer 211, the sealing layer 213, and the coloring layer 259.

The light-emitting element 230 includes the lower electrode 231, the EL layer 233, and the upper electrode 235. The lower electrode 231 is electrically connected to a source electrode or a drain electrode of the transistor 240 with the conductive layer 208 provided therebetween. An end portion of the lower electrode 231 is covered with the insulating layer 211. The light-emitting element 230 has a bottom emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the substrate 503 side through the coloring layer 259. The space between the light-emitting element 230 and the substrate 202 is filled with the sealing layer 213. The substrate 202 can be formed using a material similar to that of the substrate 201.

Figure 19A:
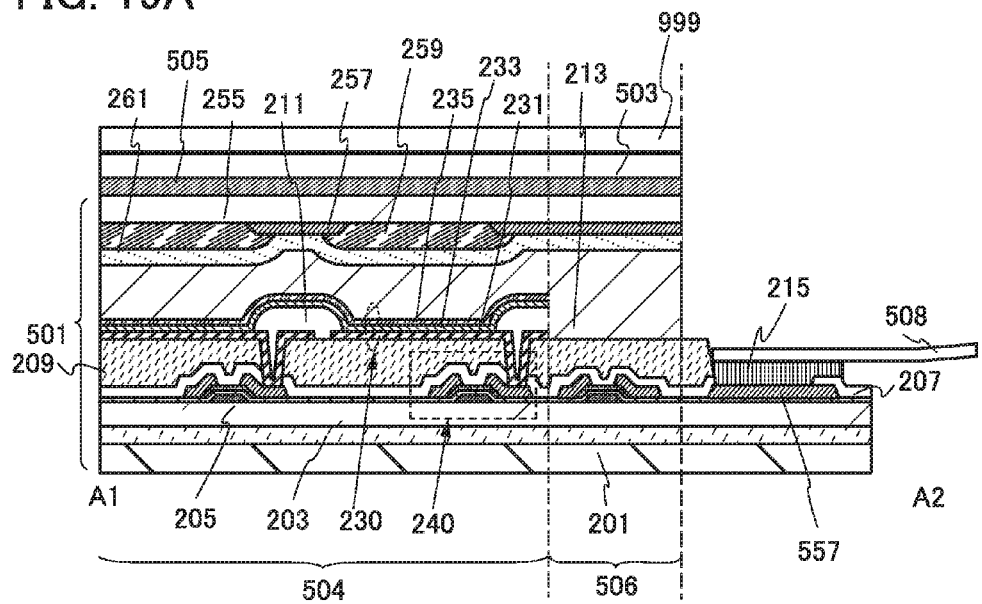
FIGS. 19A and 19B each illustrate a structural example of a light-emitting device of an embodiment.
Figure 19B:
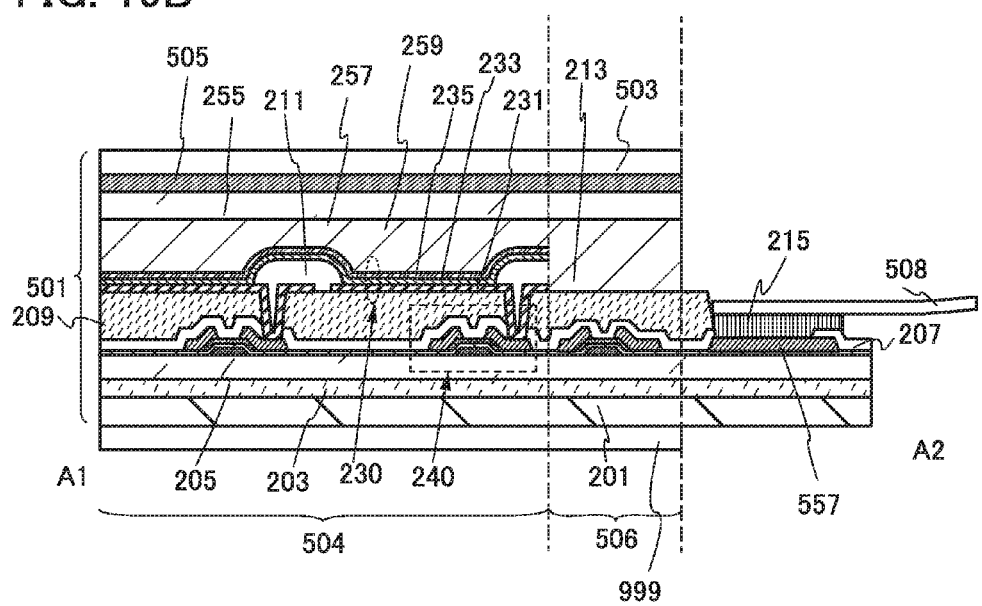

Note that the touch sensor may be provided over a different substrate from the substrate 503 and the substrate 201. As an example, FIG. 19A illustrates an example in which a touch panel 999 is provided over the substrate 503. FIG. 19B illustrates an example in which the touch panel 999 is provided under the substrate 201. The touch panel 999 is provided with a plurality of electrodes and can operate as a capacitive touch sensor.

Specific Example 7

Figure 12B:
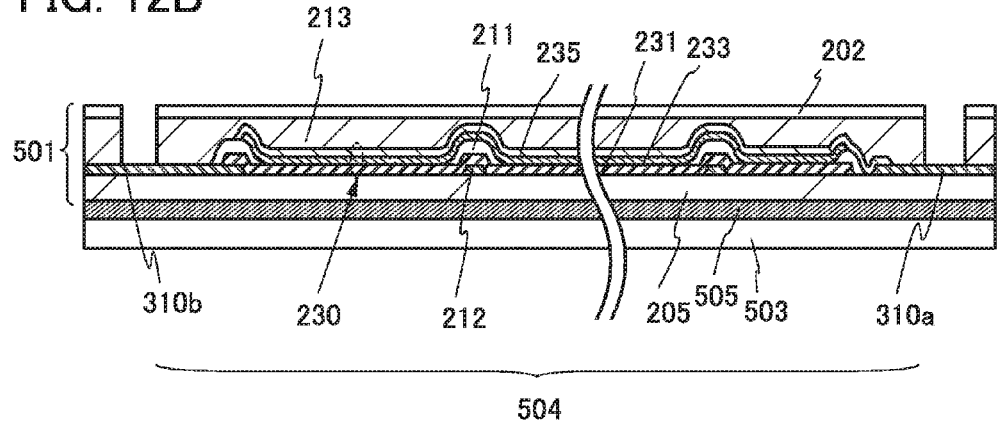

FIG. 12B illustrates another example of the light-emitting panel.

The light-emitting panel illustrated in FIG. 12B includes the element layer 501, the bonding layer 505, and the substrate 503. The element layer 501 includes the substrate 202, the insulating layer 205, a conductive layer 310a, a conductive layer 310b, the plurality of light-emitting elements, the insulating layer 211, a conductive layer 212, and the sealing layer 213.

The conductive layer 310a and the conductive layer 310b, which are external connection electrodes of the light-emitting panel, can each be electrically connected to an FPC or the like.

The light-emitting element 230 includes the lower electrode 231, the EL layer 233, and the upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The substrate 503 may have, as a light extraction structure, a hemispherical lens, a micro lens array, a film provided with an uneven surface structure, a light diffusing film, or the like. For example, the substrate 503 with a light extraction structure can be formed by attaching the above lens or film to a resin substrate with an adhesive or the like having substantially the same refractive index as the substrate, or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211.

The conductive layer 212 can be a single layer or a stacked layer formed using a material selected from copper, titanium, tantalum, tungsten, molybdenum, chromium, neodymium, scandium, nickel, or aluminum, or an alloy material containing any of these materials as its main component. The thickness of the conductive layer 212 can be greater than or equal to 0.1 µm and less than or equal to 3 µm, preferably greater than or equal to 0.1 µm and less than or equal to 0.5 µm.

When a paste (e.g., silver paste) is used as a material for the conductive layer electrically connected to the upper electrode 235, metal particles forming the conductive layer aggregate; therefore, the surface of the conductive layer is rough and has many gaps. Thus, it is difficult for the EL layer 233 to completely cover the conductive layer; accordingly, the upper electrode and the conductive layer are preferably electrically connected to each other easily.

Examples of Materials

Next, materials and the like that can be used for a light-emitting panel are described. Note that description on the components already described in this embodiment is omitted.

The element layer 501 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 501 may further include a transistor for driving the light-emitting element, a touch sensor, or the like.

The structure of the transistors in the light-emitting panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting panel includes a pair of electrodes (the lower electrode 231 and the upper electrode 235); and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an ink-jet method, a coating method, and the like.

In the element layer 501, the light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon such as a silicon nitride film or a silicon nitride oxide film, a film containing nitrogen and aluminum such as an aluminum nitride film, or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The substrate 503 has a light-transmitting property and transmits at least light emitted from the element layer 501. Furthermore, the substrate 503 may be a flexible substrate. The refractive index of the substrate 503 is higher than that of the air.

An organic resin, which is lightweight than glass, is preferably used for the substrate 503, in which case the light-emitting device can be more lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferable, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate 503 may have a stacked-layer structure in which a hard coat layer (e.g., a silicon nitride layer) by which a surface of a light-emitting device is protected from damage, a layer (e.g., an aramid resin layer) which can disperse pressure, or the like is stacked over a layer of any of the above-described materials. Furthermore, to suppress a decrease in the lifetime of the light-emitting element due to moisture and the like, the insulating film with low water permeability may be included in the stacked-layer structure.

The bonding layer 505 has a light-transmitting property and transmits at least light emitted from the light-emitting element included in the element layer 501. The refractive index of the bonding layer 505 is higher than that of the air.

For the bonding layer 505, a resin that is curable at room temperature such as a two-component-mixture type resin, a light-curable resin, a heat-curable resin, or the like can be used. The examples include an epoxy resin, an acrylic resin, a silicone resin, and a phenol resin. In particular, a material with low moisture permeability, such as an epoxy resin, is preferable.

Furthermore, the above resin may include a drying agent. As the drying agent, for example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

In addition, it is preferable to mix a filler with a high refractive index (e.g., titanium oxide) into the resin, in which case the efficiency of light extraction from the light-emitting element can be improved.

The bonding layer 505 may also include a scattering member for scattering light. For example, the bonding layer 505 can be a mixture of the resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The insulating layer 205 and the insulating layer 255 each can be formed using an inorganic insulating material. It is particularly preferable to use the insulating film with low water permeability, in which case a highly reliable light-emitting panel can be provided.

The insulating layer 207 has an effect of preventing diffusion of impurities into a semiconductor included in the transistor. As the insulating layer 207, an inorganic insulating film such as a silicon oxide film, a silicon oxynitride film, or an aluminum oxide film can be used.

As each of the insulating layers 209, 209a, and 209b, an insulating film with a planarization function is preferably selected in order to reduce surface unevenness due to the transistor or the like. For example, an organic material such as a polyimide resin, an acrylic resin, or a benzocyclobutene-based resin can be used. As an alternative to such an organic material, a low-dielectric constant material (a low-k material) or the like can be used. Note that a plurality of insulating films formed of these materials or inorganic insulating films may be stacked.

The insulating layer 211 is provided to cover an end portion of the lower electrode 231. In order that the insulating layer 211 be favorably covered with the EL layer 233 and the upper electrode 235 formed thereover, a side wall of the insulating layer 211 preferably has a tilted surface with continuous curvature.

As a material for the insulating layer 211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 211.

There is no particular limitation on the method for forming the insulating layer 211; a photolithography method, a sputtering method, an evaporation method, a droplet discharge method (e.g., an ink-jet method), a printing method (e.g., a screen printing method or an off-set printing method), or the like may be used.

The insulating layer 217 can be formed using an inorganic insulating material, an organic insulating material, a metal material, or the like. As the organic insulating material, for example, a negative or positive photosensitive resin or a non-photosensitive resin can be used. As the metal material, titanium, aluminum, or the like can be used. When a conductive material is used for the insulating layer 217 and the insulating layer 217 is electrically connected to the upper electrode 235, voltage drop due to the resistance of the upper electrode 235 can be suppressed. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating film with a planarization function for each of the insulating layers 278 and 295 in order to reduce surface unevenness due to a sensor element.

For the sealing layer 213, a resin that is curable at room temperature such as a two-component-mixture-type resin, a light-curable resin, a heat-curable resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 213. In the case where light emitted from the light-emitting element 230 is extracted outside the light-emitting panel through the sealing layer 213, the sealing layer 213 preferably includes a filler with a high refractive index or a scattering member. Materials for the drying agent, the filler with a high refractive index, and the scattering member are similar to those that can be used for the bonding layer 505.

Each of the conductive layers 556, 557, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 208, 212, 310a, and 310b can also be formed using any of the above metal materials, alloy materials, and conductive metal oxides.

Each of the conductive layers 272, 274, 281, and 283 is a conductive layer with a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be decreased. It is also preferable to use particles each coated with layers of two or more kinds of metal materials, such as particles coated with nickel and further with gold.

For the connector 215, it is possible to use a paste-like or sheet-like material which is obtained by mixture of metal particles or particles similar to the above conductive particles with a thermosetting resin and for which anisotropic electric conductivity is provided by thermocompression bonding. As the metal particles, particles in which two or more kinds of metals are layered, for example, nickel particles coated with gold are preferably used.

The coloring layer 259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be reduced. The light-blocking layer 257 can be formed using a material that blocks light emitted from the light-emitting element, for example, a metal material, a resin material including a pigment or a dye, or the like. Note that as illustrated in FIG. 9A, the light-blocking layer 257 is preferably provided also in a region other than the light extraction portion 504, such as the driver circuit portion 506, in which case undesired leakage of guided light or the like can be suppressed.

The insulating layer 261 covering the coloring layer 259 and the light-blocking layer 257 is preferably provided because it can prevent an impurity such as a pigment included in the coloring layer 259 or the light-blocking layer 257 from diffusing into the light-emitting element or the like. For the insulating layer 261, a light-transmitting material is used, and an inorganic insulating material or an organic insulating material can be used. The insulating film with low water permeability may be used for the insulating layer 261.

The above is the description of the examples on materials.

[Example of Manufacturing Method]

Next, an example of a method for manufacturing a light-emitting panel is described with reference to FIGS. 13A to 13C and FIGS. 14A to 14C. Here, the manufacturing method is described using the light-emitting panel of Specific Example 1 (FIG. 9B) as an example.

Figure 13A:
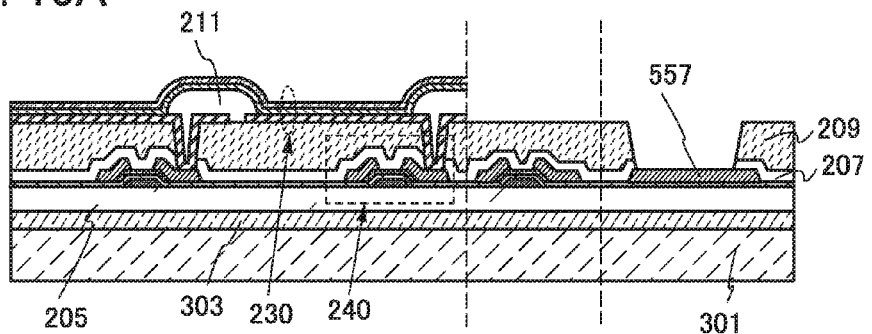
FIGS. 13A to 13C illustrate an example of a method for manufacturing a light-emitting panel of an embodiment.

First, a separation layer 303 is formed over a formation substrate 301, and the insulating layer 205 is formed over the separation layer 303. Next, the plurality of transistors, the conductive layer 557, the insulating layer 207, the insulating layer 209, the plurality of light-emitting elements, and the insulating layer 211 are formed over the insulating layer 205. An opening is formed in the insulating layers 211, 209, and 207 to expose the conductive layer 557 (FIG. 13A).

Figure 13B:
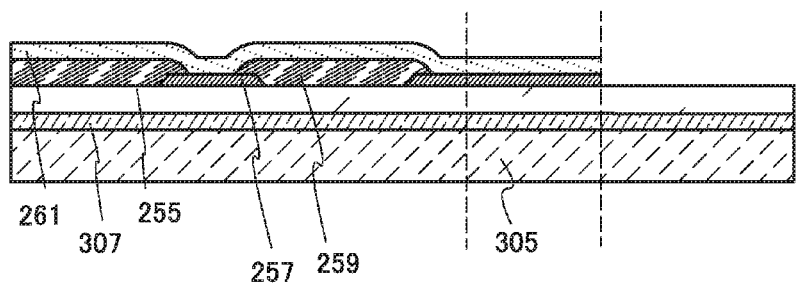

In addition, a separation layer 307 is formed over a formation substrate 305, and the insulating layer 255 is formed over the separation layer 307. Next, the light-blocking layer 257, the coloring layer 259, and the insulating layer 261 are formed over the insulating layer 255 (FIG. 13B).

The formation substrate 301 and the formation substrate 305 each can be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of the heat treatment performed later is high, a substrate having a strain point of 730° C. or higher is preferably used as the glass substrate. Note that by containing a large amount of barium oxide (BaO), a glass substrate which is heat-resistant and more practical can be obtained. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 303 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Each of the insulating layers can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film with very low water permeability.

Figure 13C:
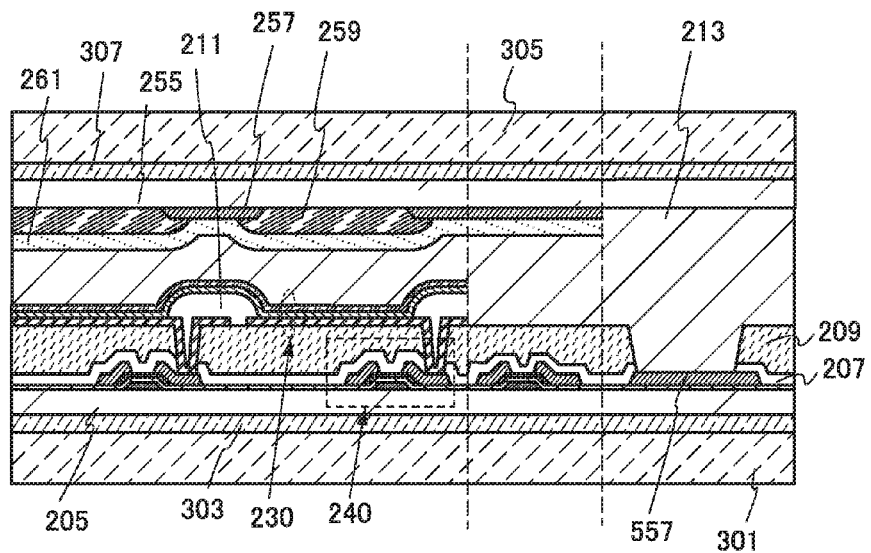

Then, a material for the sealing layer 213 is applied to a surface of the formation substrate 305 over which the coloring layer 259 and the like are formed or a surface of the formation substrate 301 over which the light-emitting element 230 and the like are formed, and the formation substrate 301 and the formation substrate 305 are attached so that these two surfaces face each other with the sealing layer 213 provided therebetween (FIG. 13C).

Next, the formation substrate 301 is separated, and the exposed insulating layer 205 and the substrate 201 are attached to each other with the bonding layer 203. Furthermore, the formation substrate 305 is separated, and the exposed insulating layer 255 and the substrate 503 are attached to each other with the bonding layer 505. Although the substrate 503 does not overlap with the conductive layer 557 in FIG. 14A, the substrate 503 may overlap with the conductive layer 557.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, a method carried out as follows may be employed: a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser light to release the nitrogen, oxygen, or hydrogen contained in the separation layer as gas, thereby promoting separation between the layer to be separated and the formation substrate. Still further alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods are combined, the separation process can be performed easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be performed by soaking the interface between the separation layer and the layer to be separated in a liquid. Furthermore, the separation may be performed while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 14A:
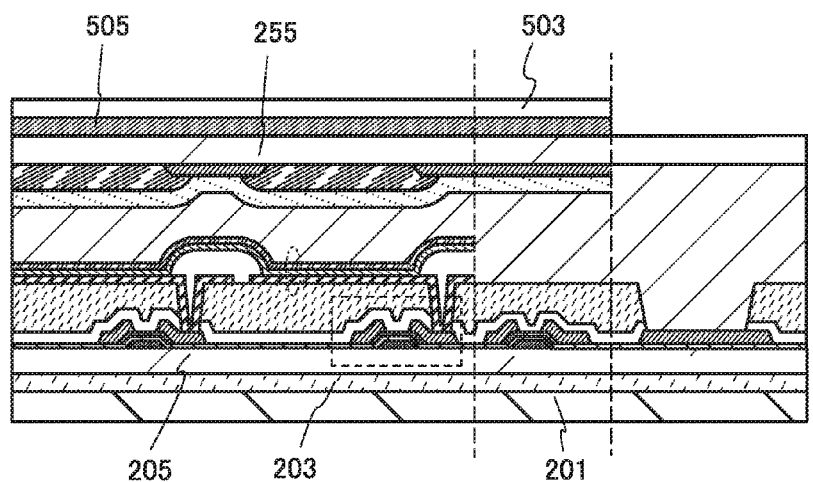
FIGS. 14A to 14C illustrate an example of a method for manufacturing a light-emitting panel of an embodiment.
Figure 14B:
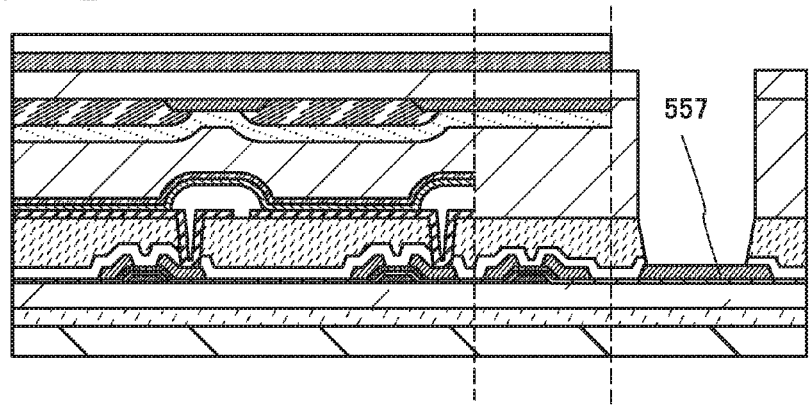
Figure 14C:
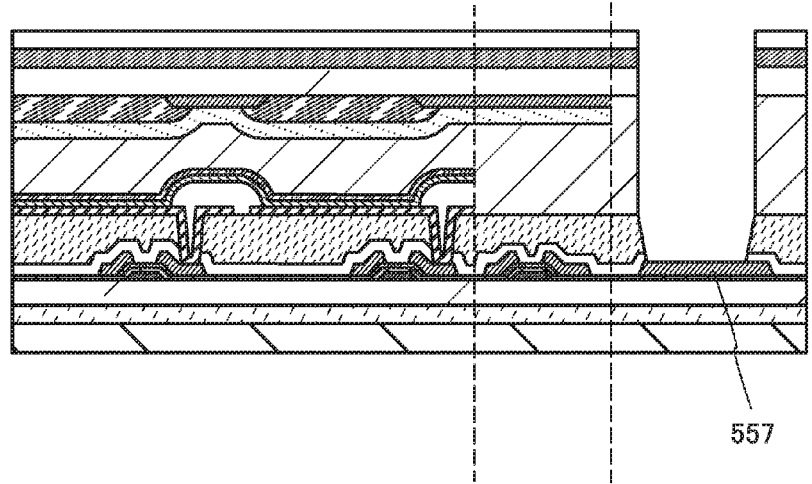

Lastly, an opening is formed in the insulating layer 255 and the sealing layer 213 to expose the conductive layer 557 (FIG. 14B). In the case where the substrate 503 overlaps with the conductive layer 557, an opening is formed also in the substrate 503 and the bonding layer 505 (FIG. 14C). The method for forming the opening is not particularly limited and may be, for example, a laser ablation method, an etching method, an ion beam sputtering method, or the like. As another method, a cut may be made in a film over the conductive layer 557 with a sharp knife or the like and part of the film may be separated by physical force.

In the above-described manner, the light-emitting panel can be manufactured.

As described above, the light-emitting panel of this embodiment includes two substrates; one is the substrate 503 and the other is the substrate 201 or the substrate 202. The light-emitting device can be formed with two substrates even when including a touch sensor. Owing to the use of the minimum number of substrates, improvement in light extraction efficiency and improvement in clarity of display can be easily achieved.

Modification Example

A light-emitting panel which is partly different from the above light-emitting panel is described below with reference to FIG. 15.

Figure 15:
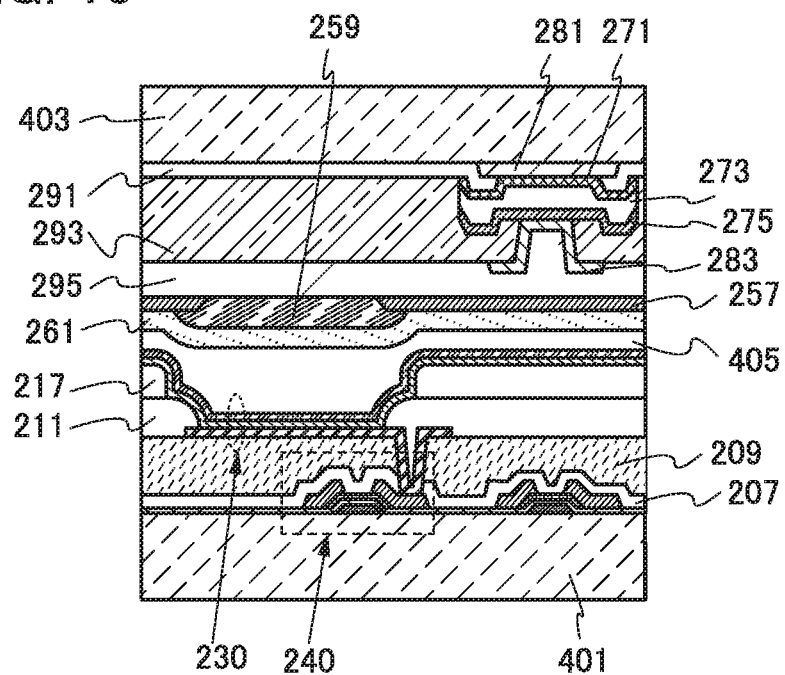
FIG. 15 illustrates a light-emitting panel of an embodiment.

A light-emitting panel illustrated in FIG. 15 includes a substrate 401, the transistor 240, the light-emitting element 230, the insulating layer 207, the insulating layer 209, the insulating layer 211, the insulating layer 217, a space 405, the insulating layer 261, the light-blocking layer 257, the coloring layer 259, a light-receiving element (including the p-type semiconductor layer 271, the i-type semiconductor layer 273, and the n-type semiconductor layer 275), the conductive layer 281, the conductive layer 283, the insulating layer 291, the insulating layer 293, the insulating layer 295, and a substrate 403.

The light-emitting panel includes a bonding layer (not illustrated) formed in a frame shape between the substrate 401 and the substrate 403 to surround the light-emitting element 230 and the light-receiving element. The light-emitting element 230 is sealed by the bonding layer, the substrate 401, and the substrate 403.

In the light-emitting panel of this embodiment, the substrate 403 has a light-transmitting property. Light emitted from the light-emitting element 230 is extracted to the air through the coloring layer 259, the substrate 403, and the like.

The light-emitting panel of this embodiment is capable of touch operation. Specifically, proximity or contact of an object on a surface of the substrate 403 can be sensed with the light-receiving element.

An optical touch sensor is highly durable and preferable because its sensing accuracy is not affected by damage to a surface that is touched by an object. An optical touch sensor is also advantageous in that it is capable of noncontact sensing, it does not degrade the clarity of images even when used in a display device, and it is applicable to large-sized light-emitting panels and display devices.

It is preferable to provide an optical touch sensor between the substrate 403 and the space 405 because the optical touch sensor is less likely to be affected by light emitted from the light-emitting element 230 and can have improved S/N ratio.

The light-blocking layer 257 overlaps with the light-receiving element on the side close to the substrate 403. The light-blocking layer 257 can prevent the light-receiving element from being irradiated with light emitted from the light-emitting element 230.

There is no particular limitation on materials used for the substrates 401 and 403. The substrate on the side from which light from the light-emitting element is extracted is formed using a material which transmits the light. For example, a material such as glass, quartz, ceramics, sapphire, or an organic resin, which is thin enough to have flexibility, can be used. Furthermore, since the substrate through which light emission is not extracted does not need to have a light-transmitting property, a metal substrate using a metal material or an alloy material or the like can be used in addition to the above-mentioned substrates. In addition, any of the materials for the substrates given in the above embodiments can also be used for the substrates 401 and 403.

A method for sealing the light-emitting panel is not limited, and either solid sealing or hollow sealing can be employed. For example, a glass material such as a glass frit, or a resin material that is curable at room temperature such as a two-component-mixture-type resin, a light curable resin, a thermosetting resin, or the like can be used. The space 405 may be filled with an inert gas such as nitrogen or argon, or with a resin or the like similar to that used for the sealing layer 213. Furthermore, the resin may include the drying agent, the filler with a high refractive index, or the scattering member.

At least part of this embodiment can be implemented as appropriate in combination with any of the other embodiments described in this specification.

Embodiment 31

In this embodiment, examples of an electronic device and a lighting device including the display device of one embodiment of the present invention will be described with reference to drawings.

As examples of electronic devices including a display device with flexibility, the following can be given: television devices (also referred to as televisions or television receivers), monitors of computers or the like, cameras such as digital cameras or digital video cameras, digital photo frames, mobile phones (also referred to as mobile phones or mobile phone devices), portable game machines, portable information terminals, audio reproducing devices, and large game machines such as pachinko machines.

In addition, a lighting device or a display device can be incorporated along a curved inside/outside wall surface of a house or a building or a curved interior/exterior surface of a car.

Figure 17A:
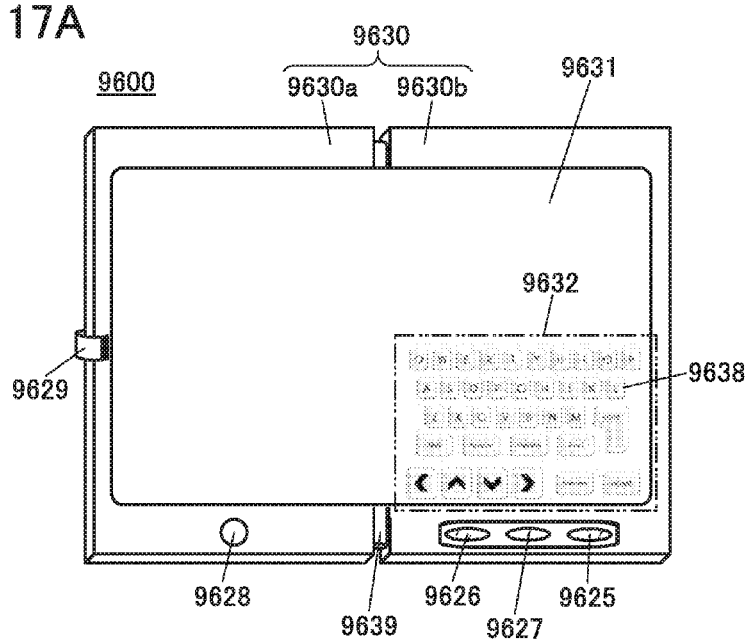
FIGS. 17A to 17C illustrate an example of an electronic device.
Figure 17B:
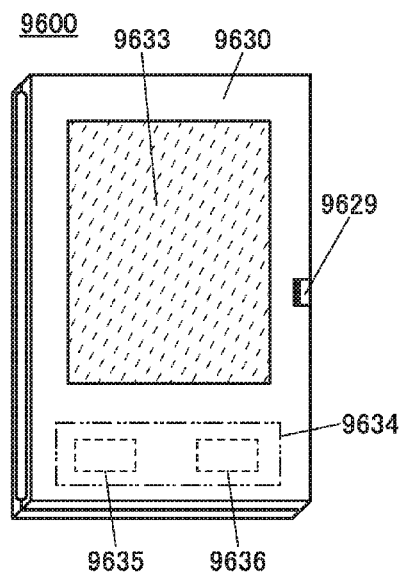

FIGS. 17A and 17B illustrate a two-foldable tablet terminal 9600. Note that here, an example of the two-foldable tablet terminal is illustrated; however, a display device of one embodiment of the present invention can be employed for those having a large folding number such as a tablet terminal foldable into three or four. In FIG. 17A, the tablet terminal 9600 is opened, and includes a housing 9630, a display portion 9631, a switch 9626 for switching display modes, a power switch 9627, a switch 9625 for switching to power-saving mode, a fastener 9629, and an operation switch 9628.

The housing 9630 includes a housing 9630a and a housing 9630b, and the housing 9630a and the housing 9630b are combined with each other with a hinge portion 9639. The housing 9630 is two-foldable owing to the hinge portion 9639.

The display portion 9631 is provided on the housing 9630a, the housing 9630b, and the hinge portion 9639. With the use of any of the display devices disclosed in this specification and the like as the display portion 9631, the tablet terminal in which the display portion 9631 can be bent and which has high reliability can be provided.

Part of the display portion 9631 can be a touch panel region 9632 and data can be input when a displayed operation key panel 9638 is touched. Note that for example, half of the display portion 9631 can have only a display function and the other half thereof can have a touch panel function. Alternatively, the whole display portion 9631 may have a touch panel function. For example, keyboard buttons can be displayed on the entire screen of the display portion 9631 so that the entire screen is used as a data input terminal.

The switch 9626 for switching a display mode allows switching between a landscape mode and a portrait mode, color display and black-and-white display, and the like.

The switch 9625 for switching to power-saving mode can control display luminance to be optimal in accordance with the amount of external light in use of the tablet terminal which is detected by an optical sensor incorporated in the tablet terminal. In addition to the optical sensor, other detecting devices such as sensors for determining inclination, such as a gyroscope or an acceleration sensor, may be incorporated in the tablet terminal.

In FIG. 17B, the tablet terminal 9600 is closed, and includes the housing 9630, a solar cell 9633, and a charge and discharge control circuit 9634. Note that FIG. 17B illustrates an example in which the charge and discharge control circuit 9634 includes a battery 9635 and a DCDC converter 9636.

With the use of any of the display devices disclosed in this specification and the like for the display portion 9631, the display portion 9631 can be folded. For example, since the tablet terminal 9600 is two-foldable, the housing 9630 can be closed when the tablet terminal is not used. Thus, the display portion 9631 can be protected by closing the housing 9630, whereby the tablet terminal 9600 can have high durability and portability and thus can have improved reliability for long-term use.

The tablet terminal illustrated in FIGS. 17A and 17B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar cell 9633, which is attached on the surface of the tablet terminal, supplies electric power to a touch panel, a display portion, an image signal processor, and the like. The solar cell 9633 can be provided on at least one surface of the housing 9630 to charge the battery 9635, which is favorable. When a lithium ion battery is used as the battery 9635, there is an advantage of downsizing or the like.

Figure 17C:
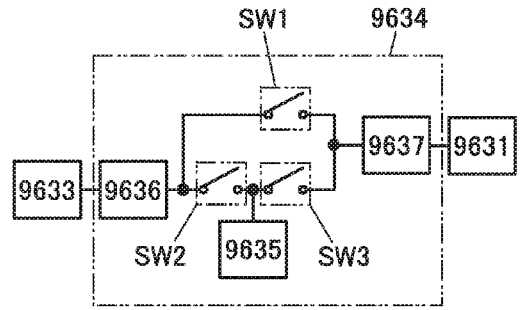

The structure and operation of the charge and discharge control circuit 9634 illustrated in FIG. 17B are described with reference to a block diagram of FIG. 17C. FIG. 17C illustrates the solar cell 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 17B.

First, an example of operation in the case where power is generated by the solar cell 9633 using external light is described. The voltage of power generated by the solar cell is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

It is needless to say that one embodiment of the present invention is not limited to the above-described electronic devices and lighting devices as long as the display device of one embodiment of the present invention is included.

At least part of this embodiment can be implemented as appropriate in combination with any of the other embodiments described in this specification.

This application is based on Japanese Patent Application serial No. 2013-181758 filed with the Japan Patent Office on Sep. 3, 2013, the entire contents of which are hereby incorporated by reference.

What is claimed is:

1. An electronic device comprising:
a first housing and a second housing adjacent to the first housing; and
a display portion over the first housing and the second housing,
wherein the display portion is foldable at a portion between the first housing and the second housing,
wherein a protective layer comprising an elastic body is provided in the portion,
wherein the first housing comprises a ferromagnet, and
wherein the second housing comprises a soft magnetic substance.

2. The electronic device according to claim 1, wherein adsorption power of the first housing and the second housing is greater than or equal to 0.1 kgf and less than or equal to 2.0 kgf when the display portion is folded.

3. The electronic device according to claim 1, wherein the ferromagnet includes one or more selected from an isotropic ferrite magnet, an anisotropic ferrite magnet, a neodymium magnet, a samarium cobalt magnet, and an alnico magnet.

4. The electronic device according to claim 1, wherein the ferromagnet is a rubber magnet or a plastic magnet.

5. The electronic device according to claim 1, wherein the soft magnetic substance includes one or more selected from the group consisting of Fe, an Fe—Ni alloy, an Fe—Si—Al alloy, and an Fe—Co alloy.

6. An electronic device comprising:
a first housing and a second housing adjacent to the first housing;
a display portion over the first housing and the second housing; and
a battery electrically connected to the display portion through a converter,
wherein the display portion is foldable at a portion between the first housing and the second housing,
wherein a protective layer comprising an elastic body is provided in the portion,
wherein the first housing comprises a ferromagnet, and
wherein the second housing comprises a soft magnetic substance.

7. The electronic device according to claim 6, wherein adsorption power of the first housing and the second housing is greater than or equal to 0.1 kgf and less than or equal to 2.0 kgf when the display portion is folded.

8. The electronic device according to claim 6, wherein the ferromagnet includes one or more selected from an isotropic ferrite magnet, an anisotropic ferrite magnet, a neodymium magnet, a samarium cobalt magnet, and an alnico magnet.

9. The electronic device according to claim 6, wherein the ferromagnet is a rubber magnet or a plastic magnet.

10. The electronic device according to claim 6, wherein the soft magnetic substance includes one or more selected from the group consisting of Fe, an Fe—Ni alloy, an Fe—Si—Al alloy, and an Fe—Co alloy.

11. An electronic device comprising:
a first housing and a second housing adjacent to the first housing; and
a display portion over the first housing and the second housing,
wherein the display portion is foldable at a portion between the first housing and the second housing,
wherein the first housing and the second housing are fixed by a magnetic force when the display portion is folded,
wherein part of the display portion that is hidden from a user of the electronic device when the display portion is folded is put in a non-light-emitting state, and
wherein adsorption power of the first housing and the second housing is greater than or equal to 0.1 kqf and less than or equal to 2.0 kqf when the display portion is folded.

12. The electronic device according to claim 11,
wherein the first housing comprises a ferromagnet, and
wherein the second housing comprises a soft magnetic substance.

13. The electronic device according to claim 12, wherein the ferromagnet includes one or more selected from an isotropic ferrite magnet, an anisotropic ferrite magnet, a neodymium magnet, a samarium cobalt magnet, and an alnico magnet.

14. The electronic device according to claim 12, wherein the ferromagnet is a rubber magnet or a plastic magnet.

15. The electronic device according to claim 12, wherein the soft magnetic substance includes one or more selected from the group consisting of Fe, an Fe—Ni alloy, an Fe—Si—Al alloy, and an Fe—Co alloy.

16. The electronic device according to claim 11, further comprising a sensor configured to determine whether the display portion is curved or not.

17. An electronic device comprising:
a first housing, a second housing adjacent to the first housing, and a third housing adjacent to the second housing; and
a display portion over the first housing, the second housing, and the third housing,
wherein the display portion is foldable at a first portion between the first housing and the second housing and at a second portion between the second housing and the third housing,
wherein a protective layer comprising an elastic body is provided in each of the first portion and the second portion,
wherein at least one of the first housing, the second housing, and the third housing comprises a ferromagnet, and
wherein the other of the first housing, the second housing, and the third housing comprises a soft magnetic substance.

18. The electronic device according to claim 17, wherein adsorption power of two of the first housing, the second housing, and the third housing is greater than or equal to 0.1 kgf and less than or equal to 2.0 kgf when the display portion is folded.

19. The electronic device according to claim 17, wherein the ferromagnet includes one or more selected from an isotropic ferrite magnet, an anisotropic ferrite magnet, a neodymium magnet, a samarium cobalt magnet, and an alnico magnet.

20. The electronic device according to claim 17, wherein the ferromagnet is a rubber magnet or a plastic magnet.

21. The electronic device according to claim 17, wherein the soft magnetic substance includes one or more selected from the group consisting of Fe, an Fe—Ni alloy, an Fe—Si—Al alloy, and an Fe—Co alloy.

22. An electronic device comprising:
a first housing, a second housing adjacent to the first housing, and a third housing adjacent to the second housing;
a display portion over the first housing, the second housing, and the third housing; and
a battery electrically connected to the display portion through a converter,
wherein the display portion is foldable at a first portion between the first housing and the second housing and at a second portion between the second housing and the third housing,
wherein a protective layer comprising an elastic body is provided in each of the first portion and the second portion,
wherein at least one of the first housing, the second housing, and the third housing comprises a ferromagnet, and
wherein the other of the first housing, the second housing, and the third housing comprises a soft magnetic substance.

23. The electronic device according to claim 22, wherein adsorption power of two of the first housing, the second housing, and the third housing is greater than or equal to 0.1 kgf and less than or equal to 2.0 kgf when the display portion is folded.

24. The electronic device according to claim 22, wherein the ferromagnet includes one or more selected from an isotropic ferrite magnet, an anisotropic ferrite magnet, a neodymium magnet, a samarium cobalt magnet, and an alnico magnet.

25. The electronic device according to claim 22, wherein the ferromagnet is a rubber magnet or a plastic magnet.

26. The electronic device according to claim 22, wherein the soft magnetic substance includes one or more selected from the group consisting of Fe, an Fe—Ni alloy, an Fe—Si—Al alloy, and an Fe—Co alloy.

27. An electronic device comprising:
a first housing, a second housing adjacent to the first housing, and a third housing adjacent to the second housing; and
a display portion over the first housing, the second housing, and the third housing,
wherein the display portion is foldable at a portion between the first housing and the second housing and at a portion between the second housing and the third housing,
wherein two of the first housing, the second housing, and the third housing are fixed by a magnetic force when the display portion is folded,
wherein part of the display portion that is hidden from a user of the electronic device when the display portion is folded is put in a non-light-emitting state, and
wherein adsorption power of two of the first housing, the second housing, and the third housing is greater than or equal to 0.1 kqf and less than or equal to 2.0 kqf when the display portion is folded.

28. The electronic device according to claim 27,
wherein the first housing comprises a ferromagnet, and
wherein the second housing comprises a soft magnetic substance.

29. The electronic device according to claim 27, further comprising a sensor configured to determine whether the display portion is curved or not.

30. The electronic device according to claim 28, wherein the ferromagnet includes one or more selected from an isotropic ferrite magnet, an anisotropic ferrite magnet, a neodymium magnet, a samarium cobalt magnet, and an alnico magnet.

31. The electronic device according to claim 28, wherein the ferromagnet is a rubber magnet or a plastic magnet.

32. The electronic device according to claim 28, wherein the soft magnetic substance includes one or more selected from the group consisting of Fe, an Fe—Ni alloy, an Fe—Si—Al alloy, and an Fe—Co alloy.

* * * * *